United States Patent
Kurokawa et al.

(10) Patent No.: US 12,412,631 B2
(45) Date of Patent: Sep. 9, 2025

(54) SEMICONDUCTOR DEVICE

(71) Applicant: SEMICONDUCTOR ENERGY LABORATORY CO., LTD., Atsugi (JP)

(72) Inventors: Yoshiyuki Kurokawa, Kanagawa (JP); Satoru Ohshita, Kanagawa (JP); Hidefumi Rikimaru, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 177 days.

(21) Appl. No.: 18/188,678

(22) Filed: Mar. 23, 2023

(65) Prior Publication Data

US 2023/0317176 A1 Oct. 5, 2023

(30) Foreign Application Priority Data

Mar. 31, 2022 (JP) .................................. 2022-058307

(51) Int. Cl.
  *G11C 5/06* (2006.01)
  *G11C 16/10* (2006.01)
  *G11C 16/26* (2006.01)

(52) U.S. Cl.
  CPC ............ *G11C 16/26* (2013.01); *G11C 16/10* (2013.01)

(58) Field of Classification Search
  CPC ....... G11C 5/063; G11C 7/18; G11C 11/4097; G11C 5/025; G11C 5/04
  USPC .............................................. 365/63, 230.05
  See application file for complete search history.

(56) References Cited

U.S. PATENT DOCUMENTS

| | | | |
|---|---|---|---|
| 8,219,758 B2 | 7/2012 | Wang et al. | |
| 8,611,121 B2 * | 12/2013 | Ahn ................... | G11C 13/0028 |
| | | | 365/230.03 |
| 9,438,234 B2 | 9/2016 | Maehashi et al. | |
| 9,728,243 B2 | 8/2017 | Kato | |
| 9,837,157 B2 | 12/2017 | Tamura | |
| 9,971,680 B2 | 5/2018 | Uesugi et al. | |
| 10,056,155 B2 * | 8/2018 | Pappu ................. | G11C 29/022 |
| 10,141,069 B2 | 11/2018 | Ikeda et al. | |
| 10,153,301 B2 | 12/2018 | Uesugi et al. | |
| 10,177,142 B2 | 1/2019 | Tamura | |

(Continued)

FOREIGN PATENT DOCUMENTS

| | | |
|---|---|---|
| JP | 2019-046199 A | 3/2019 |
| WO | WO-2020/099983 | 5/2020 |

*Primary Examiner* — Son T Dinh
(74) *Attorney, Agent, or Firm* — Fish & Richardson P.C.

(57) ABSTRACT

A semiconductor device having a novel structure is provided. The semiconductor device includes memory layers and a driver circuit layer. The memory layers are stacked over the driver circuit layer and each include a memory cell array including a plurality of memory cells. Writing or reading of data to or from one of the memory cells is controlled with a write word line, a read word line, a write bit line, and a read bit line. The driver circuit layer includes a driver circuit portion configured to drive the write word line, the read word line, the write bit line, and the read bit line; and an arithmetic circuit portion. The driver circuit portion includes a plurality of driver circuits configured to control data writing or reading on the memory cell array basis. The arithmetic circuit portion is a circuit configured to perform arithmetic processing using the data retained in the memory cell array provided in each of the memory layers and read through the driver circuit portion.

15 Claims, 18 Drawing Sheets

(56) References Cited

U.S. PATENT DOCUMENTS

| | | |
|---|---|---|
| 11,209,880 B2 | 12/2021 | Koyama et al. |
| 2015/0370313 A1 | 12/2015 | Tamura |
| 2021/0089390 A1 | 3/2021 | Lee et al. |

* cited by examiner

SEMICONDUCTOR DEVICE

BACKGROUND OF THE INVENTION

1. Field of the Invention

One embodiment of the present invention relates to a semiconductor device and the like.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

An electronic device including a semiconductor device provided with a memory circuit that retains data and an arithmetic circuit that performs arithmetic processing on data has been widely used. Techniques for improving the performance of the semiconductor device have been actively developed to process a large volume of data at high speed in such an electronic device. With the improved performance, artificial intelligence (AI) technology with a huge amount of calculation and a vast number of parameters has heat and power consumption problems; thus, techniques for suppressing heat generation and reducing power consumption have been actively developed.

In the AI technology, as typified by a neural network operation, data stored in a memory circuit is sequentially read and then used for an operation by an arithmetic circuit, and the data obtained by the operation is stored in a memory. This procedure is repeated; thus, power consumption for data transfer between the memory circuit and the arithmetic circuit is dominant. As a countermeasure, techniques called in-memory computing and near-memory computing, in which a memory circuit and an arithmetic circuit are combined, have been proposed (e.g., Patent Document 1).

Reference

[Patent Document 1] United States Patent Application Publication No. 2021/0089390

SUMMARY OF THE INVENTION

In the case where the number of data is increased in a neural network operation, the proportion of the area occupied by memory cell arrays with respect to the area occupied by an arithmetic circuit is increased. This makes a memory cell array adjacent to the arithmetic circuit and another memory cell array apart from the arithmetic circuit when the memory cell arrays are placed side by side.

In that structure, in the case where data necessary for an arithmetic operation is present in the memory cell array positioned adjacent to the arithmetic circuit, power consumption for data transfer can be suppressed. However, in the case where data is present in the memory cell array positioned apart from the arithmetic circuit, power consumption is increased. Thus, there is a limitation on the selection of a memory cell array where data is stored, and the degree of freedom is limited to achieve low power consumption.

Furthermore, in the case where the increase of memory cell arrays due to a larger number of data increases the degree of freedom in selecting a memory cell array where data is stored, there exist a memory cell array from which data contributing to an arithmetic operation is read and a memory cell array where data which does not directly contribute to the arithmetic operation is stored. In this case, the memory cell array which does not directly contribute to the arithmetic operation consumes power.

An object of one embodiment of the present invention is to provide a semiconductor device which can substantially uniform power consumed for data transfer regardless of which memory cell array data is stored in and has a degree of freedom in selecting a memory cell array where data is stored. Another object of one embodiment of the present invention is to provide a semiconductor device with excellent arithmetic efficiency, which can read data stored in a memory cell array, execute arithmetic processing, and write data to another memory cell array. Another object of one embodiment of the present invention is to provide a semiconductor device with significantly reduced power consumption which is achieved by power gating a memory cell array that does not contribute to execution of arithmetic processing. Another object of one embodiment of the present invention is to provide a semiconductor device having a novel structure.

Note that the objects of one embodiment of the present invention are not limited to the objects listed above. The objects listed above do not preclude the existence of other objects. The other objects are objects that are not described in this section and are described below. The objects that are not described in this section are derived from the description of the specification, the drawings, and the like and can be extracted as appropriate from the description by those skilled in the art. One embodiment of the present invention solves at least one of the above objects and the other objects.

One embodiment of the present invention is a semiconductor device including a plurality of memory layers each including a first transistor and a driver circuit layer including a second transistor. The memory layers are stacked over the driver circuit layer. The memory layers each include a memory cell array including a plurality of memory cells. Writing or reading of data to or from one of the memory cells is controlled with a write word line, a read word line, a write bit line, and a read bit line. The driver circuit layer includes a driver circuit portion configured to drive the write word line, the read word line, the write bit line, and the read bit line; and an arithmetic circuit portion. The driver circuit portion includes a plurality of driver circuits configured to control data writing or reading on the memory cell array basis. The memory cell array is provided in each of the memory layers. The arithmetic circuit portion is a circuit configured to perform arithmetic processing using the data retained in the memory cell array provided in each of the memory layers and read through the driver circuit portion.

In the semiconductor device of one embodiment of the present invention, the first transistor is preferably a transistor in which a semiconductor layer including a channel formation region includes an oxide semiconductor.

In the semiconductor device of one embodiment of the present invention, the oxide semiconductor preferably includes In, Ga, and Zn.

In the semiconductor device of one embodiment of the present invention, the arithmetic processing is preferably product-sum operation processing.

One embodiment of the present invention is a semiconductor device including a plurality of memory layers each including a first transistor and a driver circuit layer including a second transistor. The memory layers are stacked over the driver circuit layer. The memory layers each include a memory cell array including a plurality of memory cells. Writing or reading of data to or from one of the memory cells is controlled with a write word line, a read word line, a write bit line, and a read bit line. The driver circuit layer includes a driver circuit portion configured to drive the write word line, the read word line, the write bit line, and the read bit line; and an arithmetic circuit portion. The driver circuit portion includes a plurality of driver circuits configured to control data writing or reading on the memory cell array basis. The memory cell array is provided in each of the memory layers. The arithmetic circuit portion is configured to perform arithmetic processing using the data retained in the memory cell array provided in each of the memory layers and read through the driver circuit portion. A first memory cell array and a second memory cell array are positioned in different layers among the memory layers. The driver circuit portion is configured to read first data retained in the first memory cell array and output the first data to the arithmetic circuit portion and to write second data to the second memory cell array.

In the semiconductor device of one embodiment of the present invention, the first transistor is preferably a transistor in which a semiconductor layer including a channel formation region includes an oxide semiconductor.

In the semiconductor device of one embodiment of the present invention, the oxide semiconductor preferably includes In, Ga, and Zn.

In the semiconductor device of one embodiment of the present invention, the arithmetic processing is preferably product-sum operation processing.

One embodiment of the present invention is a semiconductor device including a plurality of memory layers each including a first transistor and a driver circuit layer including a second transistor. The memory layers are stacked over the driver circuit layer. The memory layers each include a memory cell array including a plurality of memory cells. Writing or reading of data to or from one of the memory cells is controlled with a write word line, a read word line, a write bit line, and a read bit line. The driver circuit layer includes a driver circuit portion configured to drive the write word line, the read word line, the write bit line, and the read bit line; and an arithmetic circuit portion. The driver circuit portion includes a plurality of driver circuits configured to control data writing or reading on the memory cell array basis. The memory cell array is provided in each of the memory layers. The arithmetic circuit portion is configured to perform arithmetic processing using the data retained in the memory cell array provided in each of the memory layers and read through the driver circuit portion. A first memory cell array and a second memory cell array are positioned in different layers among the memory layers. The driver circuit portion is configured to read first data retained in the first memory cell array and output the first data to the arithmetic circuit portion and to stop outputting a control signal for controlling writing or reading of data to or from the second memory cell array.

In the semiconductor device of one embodiment of the present invention, the first transistor is preferably a transistor in which a semiconductor layer including a channel formation region includes an oxide semiconductor.

In the semiconductor device of one embodiment of the present invention, the oxide semiconductor preferably includes In, Ga, and Zn.

In the semiconductor device of one embodiment of the present invention, the arithmetic processing is preferably product-sum operation processing.

Note that other embodiments of the present invention will be described in the following embodiments with reference to the drawings.

With one embodiment of the present invention, a semiconductor device which can substantially uniform power consumed for data transfer regardless of which memory cell array data is stored in and has a degree of freedom in selecting a memory cell array where data is stored can be provided. With one embodiment of the present invention, a semiconductor device with excellent arithmetic efficiency, which can read data stored in a memory cell array, execute arithmetic processing, and write data to another memory cell array can be provided. With one embodiment of the present invention, a semiconductor device with significantly reduced power consumption which is achieved by power gating a memory cell array that does not contribute to execution of arithmetic processing can be provided. With one embodiment of the present invention, a semiconductor device having a novel structure can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1:
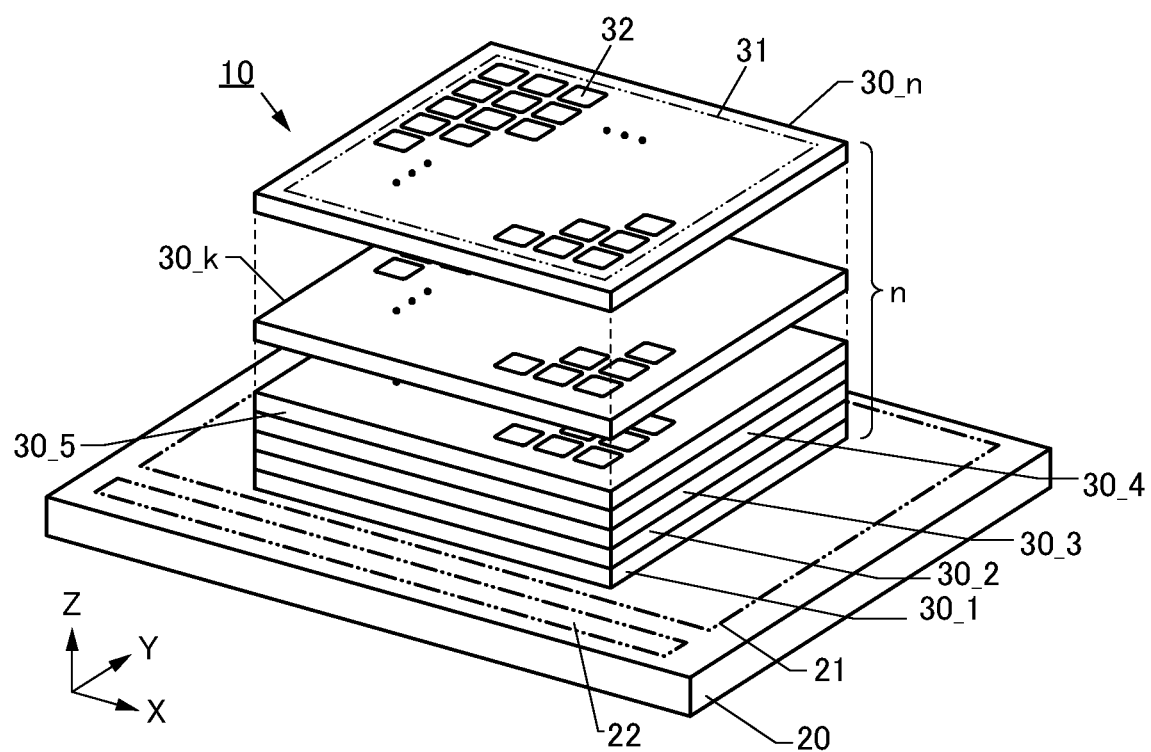
FIG. 1 illustrates a structure example of a semiconductor device.

Embodiments will be described below with reference to the drawings. The embodiments can be implemented with various modes. It will be readily appreciated by those skilled in the art that modes and details can be changed in various ways without departing from the spirit and scope of the present invention. Therefore, the present invention should not be construed as being limited to the description of embodiments below.

In the drawings, the size, the layer thickness, or the region is sometimes exaggerated for clarity. Therefore, the size, the layer thickness, or the region is not limited to the illustrated scale. Note that the drawings schematically show ideal examples, and the embodiment of the present invention is not limited to shapes or values shown in the drawings.

Unless otherwise specified, an off-state current in this specification and the like refers to a drain current of a transistor in an off state (also referred to as a non-conduction state or a cutoff state). Unless otherwise specified, the off state of an n-channel transistor means that a gate-source voltage $V_{gs}$ is lower than a threshold voltage $V_{th}$, and the off state of a p-channel transistor means that $V_{gs}$ is higher than $V_{th}$.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is referred to as an oxide semiconductor in some cases. That is, an OS transistor can also be referred to as a transistor including a metal oxide or an oxide semiconductor.

Embodiment 1

In this embodiment, a structure example of a semiconductor device will be described.

FIG. 1 is a schematic perspective view of a semiconductor device of one embodiment of the present invention.

A semiconductor device 10 illustrated in FIG. 1 includes a driver circuit layer 20 and n memory layers 30 (n is an integer greater than or equal to 2). The memory layers 30 each include a memory cell array 31. The memory cell array 31 includes a plurality of memory cells 32. The driver circuit layer 20 and the memory layers 30 are each simply referred to as a layer, in some cases.

In the description in this specification, the row direction and the column direction of the memory cells 32 in the memory cell arrays 31 on the memory layers 30 are an X direction and a Y direction, respectively, and the direction perpendicular to the surface of a substrate over which the driver circuit layer 20 is provided or the stacking direction of the n memory layers 30 is a Z direction.

As illustrated in FIG. 1, then memory layers 30 are provided over the driver circuit layer 20. Provision of the n memory layers 30 over the driver circuit layer 20 can reduce the area occupied by the semiconductor device 10. Furthermore, the storage capacity per unit area can be increased.

For example, the memory cells 32 are preferably a NOSRAM, which is a memory circuit including OS transistors. In other words, the memory layer 30 including the memory cell array 31 provided with the plurality of memory cells 32 includes OS transistors. NOSRAM (registered trademark) is an abbreviation for Nonvolatile Oxide Semiconductor Random Access Memory (RAM). The memory cells of the NOSRAM are two-transistor (2 T) or three-transistor (3 T) gain cells.

In the memory cells 32, a word line for writing data (also referred to as a write word line) and a word line for reading data (also referred to as a read word line) are preferably different wirings. Furthermore, a bit line for writing data (also referred to as a write bit line) and a bit line for reading data (also referred to as a read bit line) are preferably different wirings. With that structure with the write word line, the read word line, the write bit line, and the read bit line, data writing to the memory cell 32 and data reading from the memory cell 32 can be conducted with different wirings, which enables a structure where reading of data stored in a memory cell array and writing of data to another memory cell array are performed at the same time.

Note that the transistors included in the memory cells 32 are all preferably OS transistors. An OS transistor has an extremely low current that flows between a source and a drain in an off state, that is, an extremely low leakage current. The NOSRAM can be used as a nonvolatile memory by retaining electric charge corresponding to data in the memory cells 32, using characteristics of extremely low leakage current. In particular, the NOSRAM is capable of reading retained data without destruction (non-destructive reading), and thus is suitable for arithmetic processing in which only a data reading operation is repeated many times.

Note that examples of a metal oxide used in the OS transistors include indium oxide, gallium oxide, and zinc oxide. The metal oxide preferably contains two or three elements selected from indium, an element M, and zinc. The element M is one or more kinds of elements selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. The element M is preferably one or more kinds of elements selected from aluminum, gallium, yttrium, and tin.

It is particularly preferable that an oxide containing indium (In), gallium (Ga), and zinc (Zn) (also referred to as IGZO) be used as the metal oxide. Alternatively, it is preferable to use an oxide containing indium, tin, and zinc (also referred to as ITZO (registered trademark)). Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO). Further alternatively, it is preferable to use an oxide containing indium (In), gallium (Ga), zinc (Zn), and tin (Sn) (also referred to as IGZTO).

The metal oxide used in the OS transistors may include two or more metal oxide layers with different compositions. For example, a stacked structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed.

Alternatively, a stacked structure of one selected from indium oxide, indium gallium oxide, and IGZO, and one selected from IAZO, IAGZO, and ITZO may be employed, for example.

The metal oxide used in the OS transistors preferably has crystallinity. As the oxide semiconductor having crystallinity, a c-axis aligned crystalline oxide semiconductor (CAAC-OS), a nanocrystalline oxide semiconductor (nc-OS), and the like are given. When the oxide semiconductor having crystallinity is used, the semiconductor device can have high reliability.

In addition, the OS transistor operates stably even in a high-temperature environment and has small fluctuation in characteristics. For example, the off-state current hardly increases even in a high-temperature environment. Specifically, the off-state current hardly increases even at an environment temperature higher than or equal to room temperature and lower than or equal to 200° C. In addition, the on-state current of the OS transistor is unlikely to decrease even in a high-temperature environment. Thus, the memory cell including the OS transistor achieves a stable operation and high reliability even in a high-temperature environment.

Although a NOSRAM is taken as an example of the structure that is applicable to the memory cells 32 in this embodiment, another structure where a memory layer that can be stacked over the driver circuit layer can be formed may be employed. For example, a DOSRAM that is a memory circuit including OS transistors may be used as well. A DOSRAM (registered trademark) is an abbreviation for Dynamic Oxide Semiconductor RAM, which is a RAM including 1T1C (one-transistor and one-capacitor) memory cells. The DOSRAM is a DRAM including OS transistors. The DOSRAM is a memory that temporarily stores data sent from the outside. The DOSRAM is a memory utilizing low off-state currents of OS transistors.

A structure in which stacked memory layers are formed by connecting Si substrates which each include memory cells including Si transistors with a technique using a through electrode such as a through silicon via (TSV), a copper-copper (Cu—Cu) direct bonding technique (a technique of connecting copper (Cu) pads to each other for electrical conduction), or the like may be employed. A circuit structure of an SRAM, a DRAM, or the like may be applied to the memory cells including Si transistors.

In FIG. 1, the first memory layer 30 is denoted by a memory layer 30_1, the second memory layer 30 is denoted by a memory layer 30_2, and the third memory layer 30 is denoted by a memory layer 30_3. Furthermore, the k-th memory layer 30 (k is an integer greater than or equal to 1 and less than or equal to n) is denoted by a memory layer 30_k, and the n-th memory layer 30 is denoted by a memory layer 30_n. In this embodiment and the like, the "memory layer 30" is merely stated in some cases when describing a matter related to all the n memory layers 30 or showing a matter common to the n memory layers 30.

The driver circuit layer 20 includes a driver circuit portion 21 and an arithmetic circuit portion 22. The driver circuit portion 21 has a function of controlling data writing or reading on the memory cell array 31 basis. The memory cell array 31 is provided in each of the memory layers 30. The arithmetic circuit portion 22 has a function of performing arithmetic processing using data which has been retained in the memory cell array 31 provided in each of the memory layers 30 and has been read through the driver circuit portion 21.

The driver circuit portion 21 includes a plurality of driver circuits for driving write word lines, read word lines, write bit lines, and read bit lines connected to the memory cells 32 included in the memory cell array 31 included in each of the memory layers 30. For example, in the case of including n memory layers, n driver circuits for driving write word lines connected to the memory cells 32, n driver circuits for driving read word lines connected to the memory cells 32, n driver circuits for driving write bit lines connected to the memory cells 32, and n driver circuits for driving read bit lines connected to the memory cells 32 are provided.

The arithmetic circuit portion 22 has a function of performing arithmetic processing using data stored in the memory cells 32 in the stacked memory cell arrays 31. In the case where the memory cells 32 are compatible with non-destructive reading, a structure performing product-sum operation processing in which only a vast number of data reading operations are repeated is preferable. In the case where the product-sum operation processing is performed, the arithmetic circuit portion 22 includes a multiplier and an adder. The arithmetic circuit portion 22 may execute an arithmetic operation utilizing only data in a target memory cell array 31 or data of a plurality of memory cell arrays 31. For example, the arithmetic circuit portion 22 can perform an arithmetic operation using data read from all the memory cell arrays 31, data read from one of the memory cell arrays 31, or data read from some of the memory cell arrays 31.

The driver circuit portion 21 and the arithmetic circuit portion 22 can be provided in a region overlapping with the n memory layers 30. Furthermore, part of the function of the driver circuit portion 21 may be executed using the OS transistor in each of the n memory layers 30. This structure can reduce the area occupied by the driver circuit portion 21. Alternatively, some of the functions of the driver circuit portion 21 and the arithmetic circuit portion 22 may be executed using the OS transistor in each of the n memory layers 30. This structure can reduce the area occupied by the arithmetic circuit portion.

In the structure in FIG. 1, for example, the driver circuit layer 20 including the driver circuit portion 21 and the arithmetic circuit portion 22 can be formed using transistors that include silicon in their semiconductor layers including channel formation regions (Si transistors) to form a CMOS circuit (Si CMOS circuit), and the memory layers 30 including the memory cell arrays 31 can be formed using OS transistors. With this structure, the memory cell arrays can be placed over the Si CMOS circuit, and the chip area can be reduced. Furthermore, since the driver circuit portion 21 and the arithmetic circuit portion 22 can be formed with the CMOS circuit, high-speed operation is possible.

For the semiconductor layer including the channel formation region of the Si transistor, one or a combination of a single crystal semiconductor, a polycrystalline semiconductor, a microcrystalline semiconductor, an amorphous semiconductor, and the like can be used. As a semiconductor material, germanium or the like as well as silicon can be used, for example. Alternatively, a compound semiconductor such as silicon germanium, silicon carbide, gallium arsenide, or a nitride semiconductor can be used.

In the structure of FIG. 1, the path from the memory cell array 31 in each of the memory layers 30 through the driver circuit portion 21 to the arithmetic circuit portion 22 can be shorter than that of the case where the memory cell arrays 31 are placed side by side over a surface of the driver circuit layer 20. In other words, in the structure of FIG. 1, the difference in length between the path from the memory cell array 31 of the memory layer 30 positioned in the vicinity of the surface of the driver circuit layer 20 (the memory cell array positioned in the lowermost memory layer) to the arithmetic circuit portion 22 and the path from the memory cell array 31 of the memory layer 30 positioned apart from the surface of the driver circuit layer 20 (the memory cell array positioned in the uppermost memory layer) to the arithmetic circuit portion 22 can be reduced.

The difference in length of the path between the memory cell array 31 and the arithmetic circuit portion 22 causes differences in parasitic capacitance and parasitic resistance and then leads to differences in signal delay and power consumption. Thus, in the structure of FIG. 1, data can be read from each of the memory cell arrays 31 of the memory layers 30 with similar signal delay and power consumption. Accordingly, computing performance, power consumption, and arithmetic efficiency are not largely different depending on which of the memory cell arrays 31 data is stored in, whereby the degree of freedom in data storage is increased.

Figure 2:
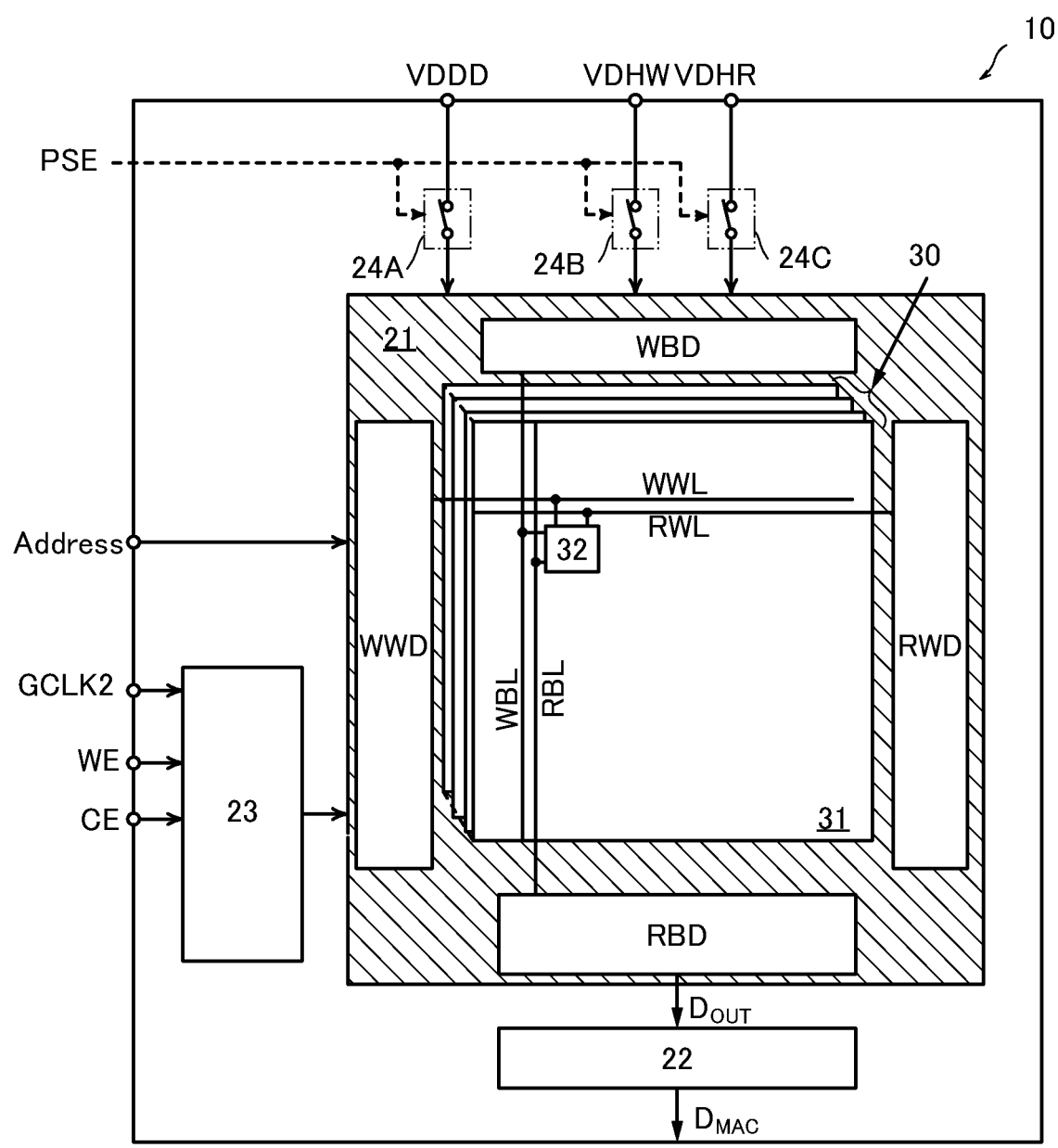
FIG. 2 illustrates the structure example of the semiconductor device.
Figure 3:
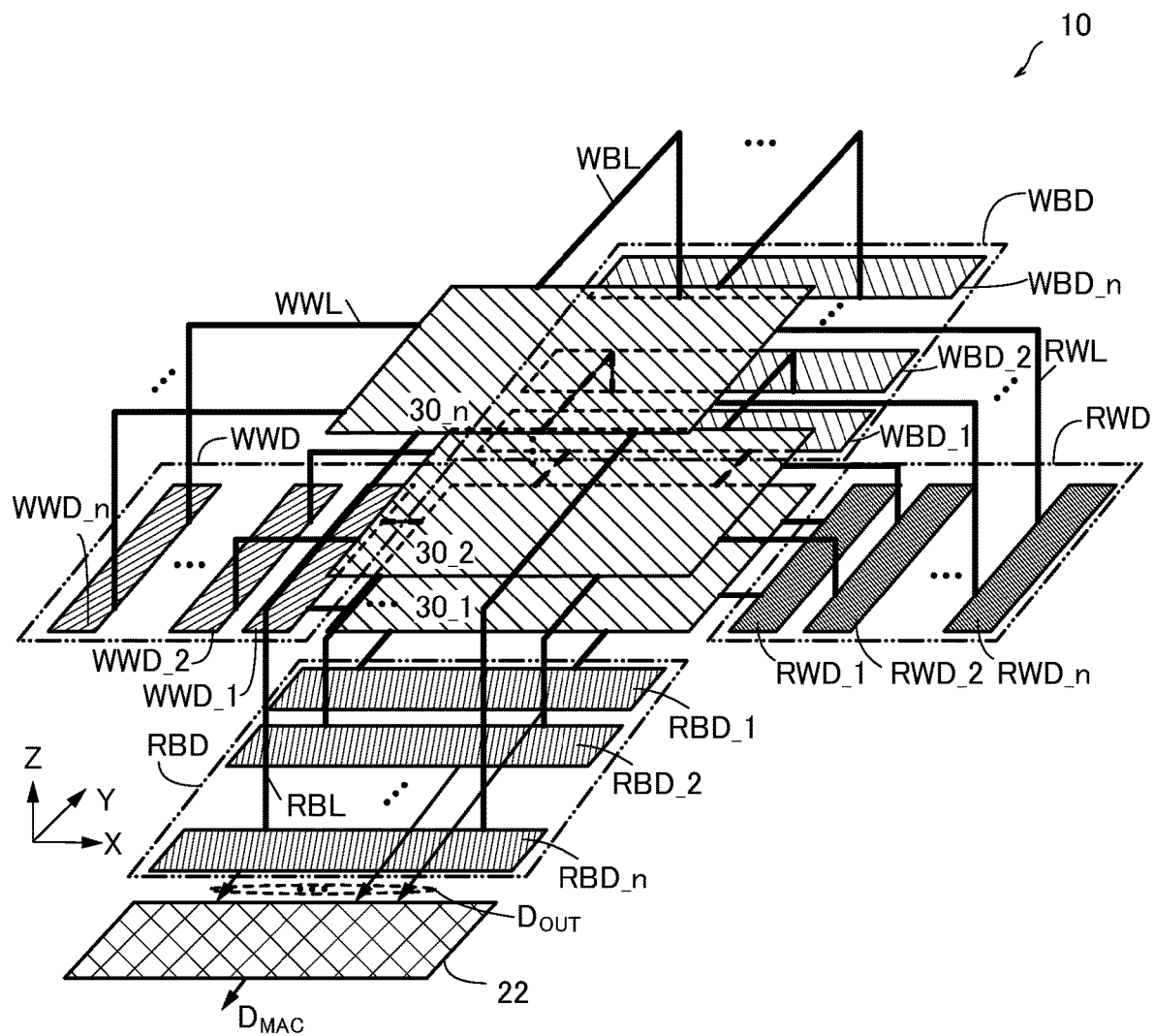
FIG. 3 illustrates the structure example of the semiconductor device.
Figure 4A:
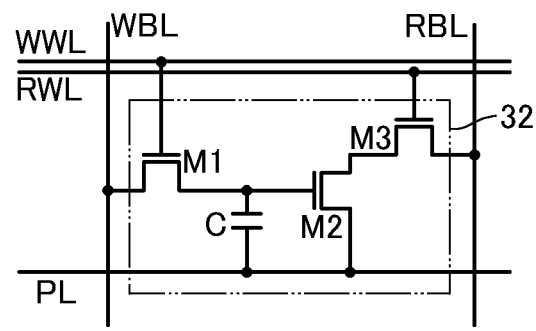
FIGS. 4A and 4B illustrate the structure example of the semiconductor device.
Figure 4B:
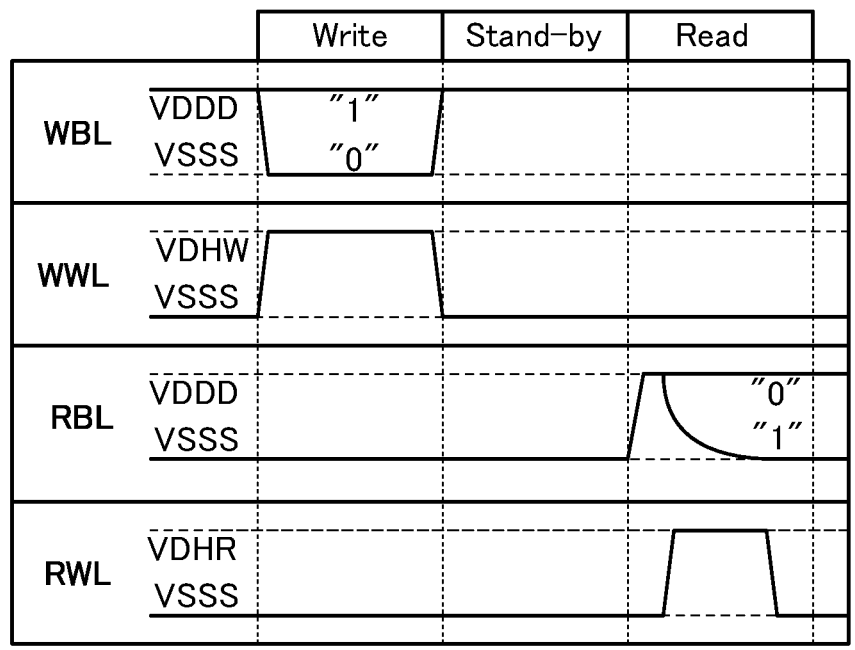

FIG. 2 is a block diagram illustrating a structure example of the memory cell array 31 and the driver circuit portion 21 in the semiconductor device 10 described in FIG. 1. FIG. 3 is a schematic diagram illustrating the plurality of driver circuits included in the driver circuit portion 21 and a placement example thereof. FIG. 4A is a circuit diagram of a NOSRAM applicable to the memory cells 32. FIG. 4B is a timing chart illustrating an operation of the NOSRAM illustrated in FIG. 4A.

In the semiconductor device 10 of FIG. 2, the memory cell array 31 provided in each of then stacked memory layers 30 is illustrated. In the semiconductor device 10 of FIG. 2, a driver circuit WWD, a driver circuit WBD, a driver circuit RWD, and a driver circuit RBD included in the driver circuit portion 21 are illustrated. In the semiconductor device 10 of FIG. 2, the memory cell 32 connected to a wiring WWL, a wiring WBL, a wiring RWL, and a wiring RBL is illustrated. In the semiconductor device 10 of FIG. 2, power switches 24A to 24C are illustrated. In the semiconductor device 10 of FIG. 2, a control circuit 23 is illustrated. In the semiconductor device 10 of FIG. 2, the arithmetic circuit portion 22 is illustrated.

The wiring WWL is a write word line, to which a write control signal is supplied by the driver circuit WWD. The wiring WBL is a write bit line, to which a signal of data to be written is supplied by the driver circuit WBD. The wiring RWL is a read word line, to which a read control signal is supplied by the driver circuit RWD. The wiring RBL is a read bit line, to which a signal of data in the memory cell 32 is read by the driver circuit RBD. Since the memory cell array 31 including the memory cell 32 is provided in every memory layer 30, the memory cell arrays 31 can be provided to be stacked as described in FIG. 1.

The number of driver circuits WWD, the number of driver circuits WBD, the number of driver circuits RWD, and the number of driver circuits RBD are each n, which corresponds to the number of stacked memory layers 30. Specifically, as illustrated in FIG. 3, the driver circuit WWD, the driver circuit WBD, the driver circuit RWD, and the driver circuit RBD include driver circuits WWD_1 to WWD_n, driver circuits WBD_1 to WBD_n, driver circuits RWD_1 to RWD_n, and driver circuits RBD_1 to RBD_n, respectively, corresponding to the memory layers 30_1 to 30_n.

The driver circuit WWD_1 is connected to the wiring WWL functioning as a write word line connected to the memory cell 32 of the memory cell array 31 included in the memory layer 30_1. Similarly, the driver circuits WWD_2 to WWD_n are connected to the wirings WWL functioning as write word lines connected to the memory cells 32 of the memory cell arrays 31 included in the memory layers 30_2 to 30_n. Similarly, the driver circuits WBD_1 to WBD_n, the driver circuits RWD_1 to RWD_n, and the driver circuits RBD_1 to RBD_n are connected to the wirings WBL, RWL, and RBL connected to the memory cells 32 of the memory cell arrays 31 included in the memory layers 30_1 to 30_n.

The driver circuits WWD_1 to WWD_n, the driver circuits WBD_1 to WBD_n, the driver circuits RWD_1 to RWD_n, and the driver circuits RBD_1 to RBD_n can independently drive the memory cell array 31 in each of the memory layers 30. Therefore, while a first arithmetic operation is executed in the arithmetic circuit portion 22, second data used for a second arithmetic operation can be rewritten to memory cell arrays other than a first memory cell array where first data used for the first arithmetic operation is stored. That is, the memory cell arrays provided in different memory layers can independently perform a writing operation or a reading operation; thus, an update to second data can be performed while the first arithmetic operation is executed. Accordingly, a semiconductor device with high arithmetic efficiency can be provided.

While the first arithmetic operation is executed in the arithmetic circuit portion 22, the memory cell arrays other than the first memory cell array where the first data used for the first arithmetic operation is stored can be power gated. For example, in the case where an arithmetic operation is executed using data stored in the memory cell array 31 of the memory layer 30_1, the driver circuits WWD_2 to WWD_n, the driver circuits WBD_2 to WBD_n, the driver circuits RWD_2 to RWD_n, and the driver circuits RBD_2 to RBD_n which drive the memory cell arrays 31 of the memory layers 30_2 to 30_n can be power gated. Accordingly, a semiconductor device with low power consumption can be provided.

The power switch 24A controls supply of a voltage VDDD that is to be supplied to the driver circuit WBD, the driver circuit RBD, and the memory cell array. By controlling on/off of the power switch 24A, power gating of the memory layers 30_1 to 30_n and power gating of the driver circuits WBD_1 to WBD_n and the driver circuits RBD_1 to RBD_n can be individually controlled. Although one switch is illustrated as the power switch 24A in FIG. 2, a plurality of switches may be used as the power switch 24A. On/off of the power switch 24A is individually controlled with a signal PSE which controls power gating.

The power switch 24B controls supply of a voltage VDHW that is to be supplied to the driver circuit WWD. By controlling on/off of the power switches 24B, power gating of the driver circuits WWD_1 to WWD_n can be individually controlled. Although one switch is illustrated as the power switch 24B in FIG. 2, a plurality of switches may be used as the power switch 24B. On/off of the power switch 24B is individually controlled with the signal PSE which controls power gating.

The power switch 24C controls supply of a voltage VDHR that is to be supplied to the driver circuit RWD. By controlling on/off of the power switches 24C, power gating of the driver circuits RWD_1 to RWD_n can be individually controlled. Although one switch is illustrated as the power switch 24C in FIG. 2, a plurality of switches may be used as the power switch 24C. On/off of the power switch 24C is individually controlled with the signal PSE which controls power gating.

To the semiconductor device 10 illustrated in FIG. 2, a clock signal GCLK2, an address signal Address, a signal CE, and a signal WE are input. The signal CE and the signal WE are a chip enable signal and a write enable signal, respectively. The clock signal GCLK2, the signal CE, and the signal WE are input to the control circuit 23. The address signal Address is input to each of the driver circuits included in the driver circuit portion 21. The address signal Address is a signal that specifies the memory cell 32 included in the memory cell array 31 in any of the memory layers 30_1 to 30_n.

The control circuit 23 has a function of controlling the overall operation of the semiconductor device 10. For example, the control circuit 23 performs a logical operation of the signal CE and the signal WE to determine whether access from the outside is write access or read access. The control circuit 23 outputs a signal that controls each of the driver circuits and the like included in the driver circuit portion 21 in accordance with the determination.

The arithmetic circuit portion 22 has a function of performing arithmetic processing such as product-sum operation processing using data $D_{OUT}$ read from the memory cell array 31 included in the memory layers 30_1 to 30_n through the driver circuit RBD. In the case where the data $D_{OUT}$ is analog data, by being provided with a circuit that converts analog data to digital data, the arithmetic circuit portion 22 can perform arithmetic processing regardless of whether the data retained in the memory cell 32 is analog data or digital data.

The arithmetic circuit portion 22 has a function of outputting data $D_{MAC}$ having being subjected to arithmetic processing. The data $D_{MAC}$ having being subjected to arithmetic processing can be output to the outside of the semiconductor device 10 through an input/output circuit or the like. FIG. 3 illustrates the arithmetic circuit portion 22 reading the data $D_{OUT}$ from the memory layers 30_1 to 30_n through the driver circuits RBD_1 to RBD_n and outputting the data $D_{MAC}$. Since the data $D_{OUT}$ output from the plurality of memory cell arrays is output to the outside as the data having being subjected to arithmetic processing, the amount of data $D_{MAC}$ output to the outside of the semiconductor device 10 can be reduced compared with the structure where the data $D_{OUT}$ is directly output.

As described above, the arithmetic processing in the arithmetic circuit portion 22 can be executed using data read from all the memory cell arrays 31. Alternatively, the arithmetic processing can be executed using data read from one of the memory cell arrays 31. Alternatively, the arithmetic processing can be executed using data read from some of the memory cell arrays 31. In the structure of one embodiment of the present invention, the path from the memory cell array 31 in the memory layer 30 through the driver circuit portion 21 to the arithmetic circuit portion 22 can be shorter than that of the case where the memory cell arrays 31 are placed side by side over the surface of the driver circuit layer 20. Accordingly, computing performance, power consumption, and arithmetic efficiency are not largely different depending on which of the memory cell arrays 31 data is read from, whereby the degree of freedom in data reading is increased.

FIG. 4A illustrates an example of a circuit structure of a memory cell of a NOSRAM applicable to the memory cells 32 included in the memory cell array 31. The memory cell 32 illustrated in FIG. 4A includes a transistor M1, a transistor M2, a transistor M3, and a capacitor C. As the transistors M1 to M3, OS transistors can be used. FIG. 4A illustrates the wiring WWL, the wiring RWL, the wiring WBL, the wiring RBL, and a wiring PL connected to the elements in the memory cell 32. The wiring PL has a function of a capacitor line and can also function as a wiring that supplies a potential to backgates of the transistors.

The circuit structure of the memory cell 32 is not limited to that illustrated in FIG. 4A. For example, the transistor M3 may be omitted. Alternatively, the capacitor C may be omitted by using parasitic capacitance, gate capacitance, or the like instead. The transistors M1 to M3 may or may not have a back gate.

An operation example of the memory cell 32 is described with reference to FIG. 4B. FIG. 4B is a timing chart illustrating the operation example of the memory cell 32. In a writing operation state (Write), a reading operation state (Read), and a stand-by state (Stand-by), the power switches 24A to 24C are on, VDDD, VDHW, and VDHR are input to the driver circuits as "H" potential, and VSSS is input to the driver circuits as "L" potential.

When the signal CE at "H" and the signal WE at "H" are input, the memory cell 32 performs a writing operation. The wiring WWL in the row selected by the driver circuit WWD is at "H," and the wiring RWL in the row selected by the driver circuit RWD is at "L." A voltage corresponding to data is input to the wiring WBL selected by the driver circuit WBD. The wiring RBL selected by the driver circuit RBD is at "L." This control can be independently conducted by each of the driver circuits corresponding to the memory cell arrays 31 provided in the memory layers 30. The gate voltage of the transistor M2 of the selected memory cell 32 becomes VDDD when data "1" is written, and becomes VSSS when data "0" is written.

When the signal CE at "H" and the signal WE at "L" are input, the memory cell 32 performs a reading operation. The driver circuit RBD precharges the selected wiring RBL to the voltage VDDD. Next, the wiring RWL in the row selected by the driver circuit RWD is set to "H." When the memory cell 32 in the selected row retains data "1," the voltage VDDD is input to the gate of the transistor M2; thus, a large current flows between the source and the drain of the transistor M2. Consequently, the wiring RBL is discharged promptly and the potential of the wiring RBL is decreased. When the memory cell 32 in the selected row retains data "0," the potential VSSS is input to the gate of the transistor M2; thus, a drain current hardly flows through the transistor M2. Consequently, the precharge voltage (VDDD) is kept at the wiring RBL.

In a period other than the periods of the writing operation and the reading operation, the wiring WWL and the wiring RBL are at "L." The transistors M1 and M3 in the memory cell 32 are off. The memory cell 32 does not have a limit on the number of times of data rewriting in principle, can perform data rewriting with low energy, and does not consume power in retaining data. Since the transistors M1 to M3 are OS transistors with extremely low off-state currents, when the transistor M1 and the transistor M3 are off, the memory cell 32 can retain data for a long time. The memory cell array 31 including the memory cells 32 can be a nonvolatile low-power-consumption memory device which can control data writing and reading independently in each memory layer.

In this case, a structure where the memory cell array 31 to or from which data is not written or read and the driver circuit portion 21 which drives the memory cell array 31 can be independently power gated can be employed. For example, when the memory cell array 31 in any of the memory layers 30_1 to 30_n is in the stand-by state for more than a certain period, the power switches 24A to 24C are selectively turned off and the input of the clock signal GCLK2 is stopped. This selectively power gates the memory cell array 31, the driver circuit WWD, the driver circuit WBD, the driver circuit RWD, or the driver circuit RBD, and the power consumption of the semiconductor device 10 can be reduced.

Figure 5A:
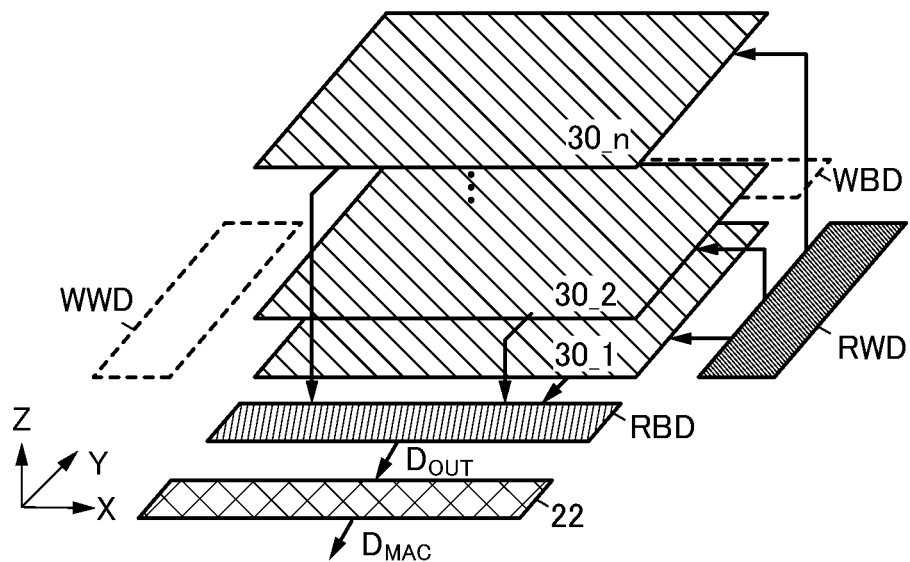
FIGS. 5A and 5B illustrate the structure example of the semiconductor device.

For example, in the case where data is read from the memory cell arrays 31 of the memory layers 30_1 to 30_*n* with the driver circuit RWD and the driver circuit RBD, an operation of writing data to the memory cell array 31 is not performed for a certain period. A structure which stops the supply of power supply voltages to the driver circuit WWD and the driver circuit WBD is preferable. This structure is illustrated in a schematic diagram of FIG. 5A. The driver circuit WWD and the driver circuit WBD to which the supply of power supply voltages is being stopped (which are being power gated) are illustrated by broken lines. The stop of the supply of the power supply voltages to the driver circuit WWD and the driver circuit WBD can be performed by controlling the power switches 24A to 24C. With this structure, power consumption of the semiconductor device 10 can be reduced.

Figure 5B:
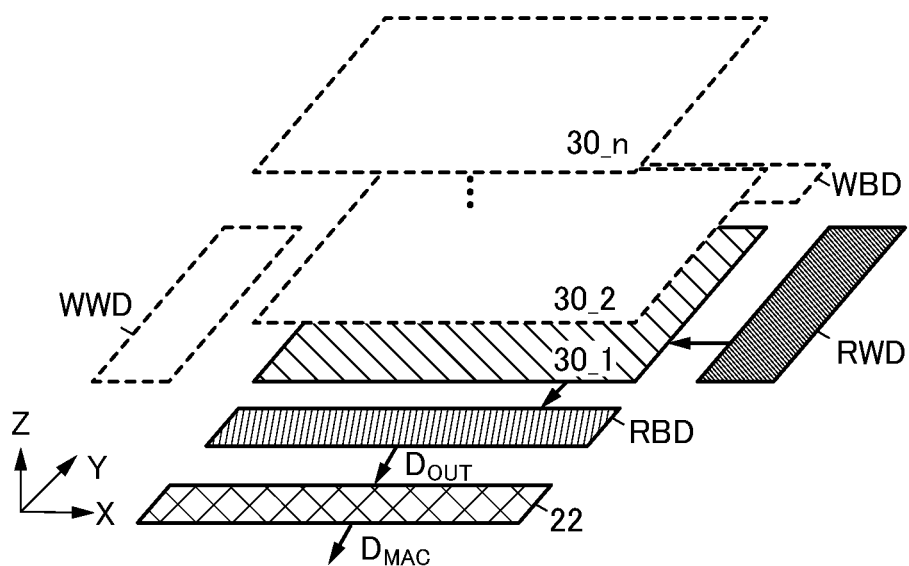

For example, in the case where data is read from the memory cell array 31 of the memory layer 30_1 with the driver circuit RWD and the driver circuit RBD and data is not read from the memory cell arrays 31 of the memory layers 30_2 to 30_*n*, an operation of writing data to the memory cell arrays 31 and an operation of reading data from the memory cell arrays 31 of the memory layers 30_2 to 30_*n* are not performed for a certain period. A structure where the supply of power supply voltages to the memory cell arrays 31 of the memory layers 30_2 to 30_*n* in addition to the driver circuit WWD and the driver circuit WBD is stopped is preferable. This structure is illustrated in a schematic diagram of FIG. 5B. The driver circuit WWD, the driver circuit WBD, and the memory layers 30_2 to 30_*n* to which the supply of power supply voltages is being stopped are illustrated by broken lines. The stop of the supply of the power supply voltages to the driver circuit WWD, the driver circuit WBD, and the memory cell arrays 31 of the memory layers 30_2 to 30_*n* can be performed by controlling the power switches 24A to 24C. With this structure, power consumption of the semiconductor device 10 can be reduced.

Figure 6A:
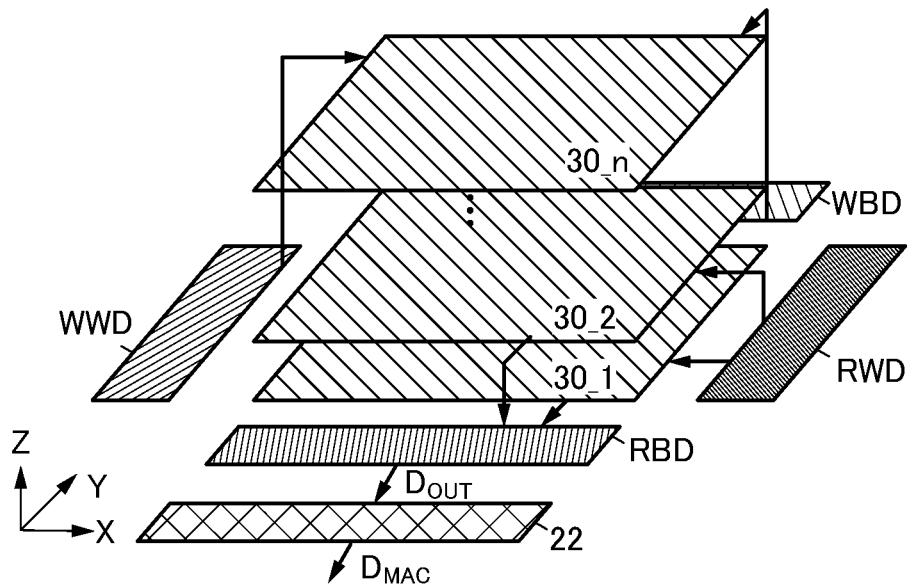
FIGS. 6A and 6B illustrate the structure example of the semiconductor device.

For example, data can be written to the memory cell array 31 of the memory layer 30_*n* using the driver circuit WWD and the driver circuit WBD, and data can be read from the memory cell arrays 31 of the memory layers 30_1 and 30_2 using the driver circuit RWD and the driver circuit RBD. This structure is illustrated in a schematic diagram of FIG. 6A. In the structure of one embodiment of the present invention, the path from the memory cell array 31 in the memory layer 30 through the driver circuit portion 21 to the arithmetic circuit portion 22 can be shorter than that of the case where the memory cell arrays 31 are placed side by side over the surface of the driver circuit layer 20. Accordingly, computing performance, power consumption, and arithmetic efficiency are not largely different depending on which of the memory cell arrays 31 data is read from, whereby the degree of freedom in data reading is increased. Since the memory cell arrays of the memory layers 30 where data is stored are not limited, data writing and reading can be performed limitlessly.

Figure 6B:
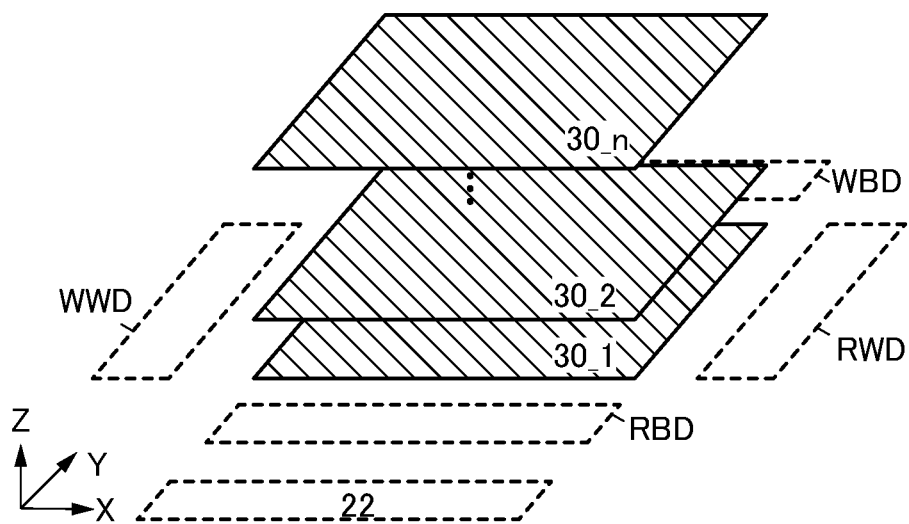

For example, in the case where data is not written to and read from the memory cell arrays 31 of the memory layers 30_1 to 30_*n*, a structure where the supply of power supply voltages to the driver circuit RWD, the driver circuit RBD, the driver circuit WWD, and the driver circuit WBD is stopped is preferable. This structure is illustrated in a schematic diagram of FIG. 6B. The driver circuit RWD, the driver circuit RBD, the driver circuit WWD, and the driver circuit WBD to which the supply of power supply voltages is being stopped are illustrated by broken lines. The stop of the supply of the power supply voltages to the driver circuit RWD, the driver circuit RBD, the driver circuit WWD, and the driver circuit WBD can be performed by controlling the power switches 24A to 24C. With this structure, power consumption of the semiconductor device 10 can be reduced.

In the case where the memory cell 32 is a NOSRAM or a DOSRAM, the other portions such as the driver circuit RWD, the driver circuit RBD, the driver circuit WWD, and the driver circuit WBD is preferably power gated with a voltage that turns off the access transistor (the transistor M1 in FIG. 4A) applied to the wiring WWL connected to the gate of the access transistor. With this structure, the supply of power supply voltages can be stopped while data is stored in the memory cell 32.

In the case where the memory cell 32 is an SRAM, the other portions (driver circuits) are power gated with the power supply voltage supplied to the SRAM and with the voltage that turns off the access transistor applied to the write word line. With this structure, the memory cell array 31 which does not directly contribute to the arithmetic operation in the arithmetic circuit portion 22 can be power gated, whereby the semiconductor device with reduced power consumption can be achieved.

This embodiment can be implemented in combination with any of the other embodiments described in this specification as appropriate.

Embodiment 2

In this embodiment, a variation of the semiconductor device described in the above embodiment will be described. Components in common with those in Embodiment 1 are denoted by common reference numerals, and description thereof is omitted.

Figure 7:
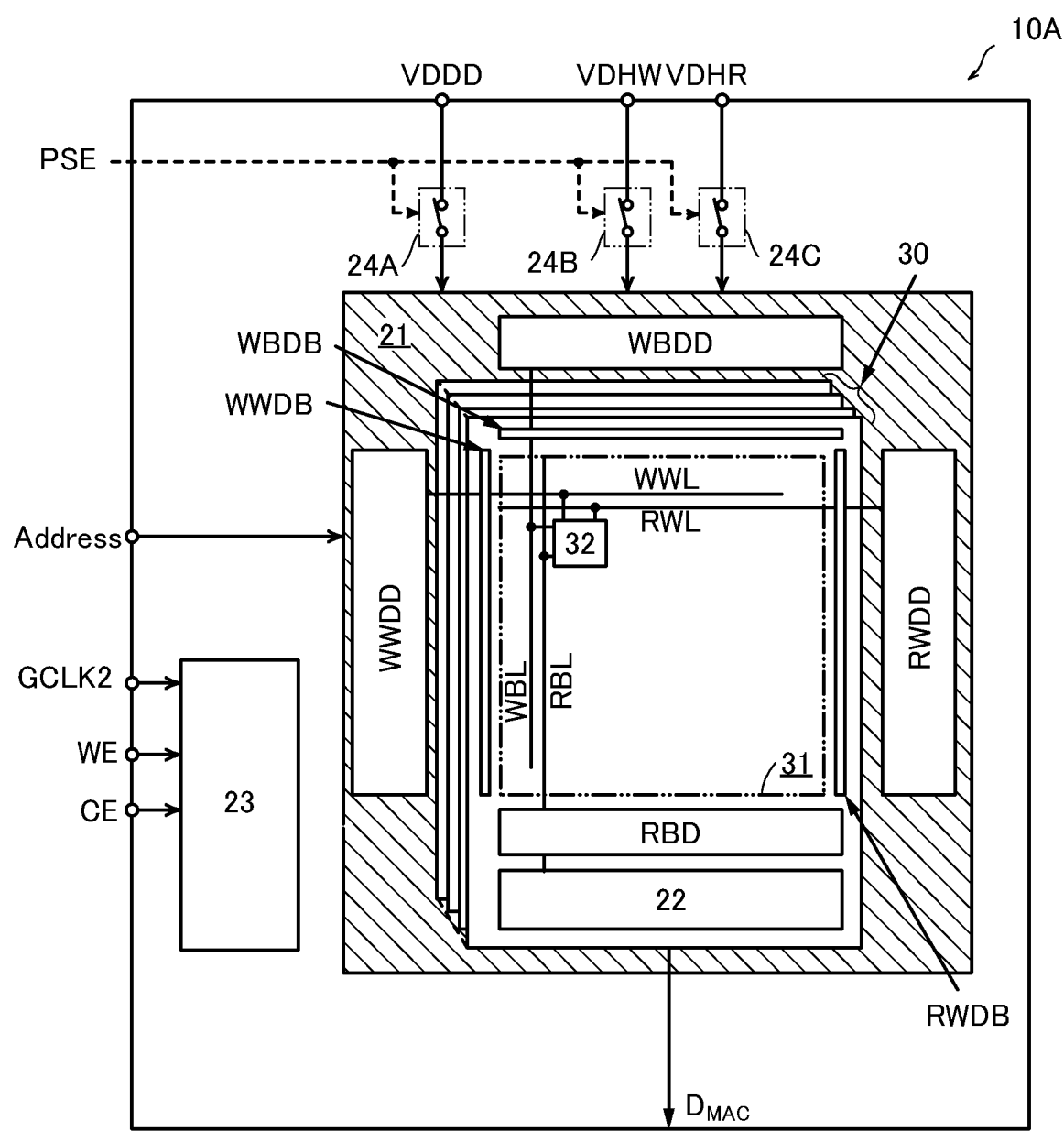
FIG. 7 illustrates a structure example of a semiconductor device.
Figure 8:
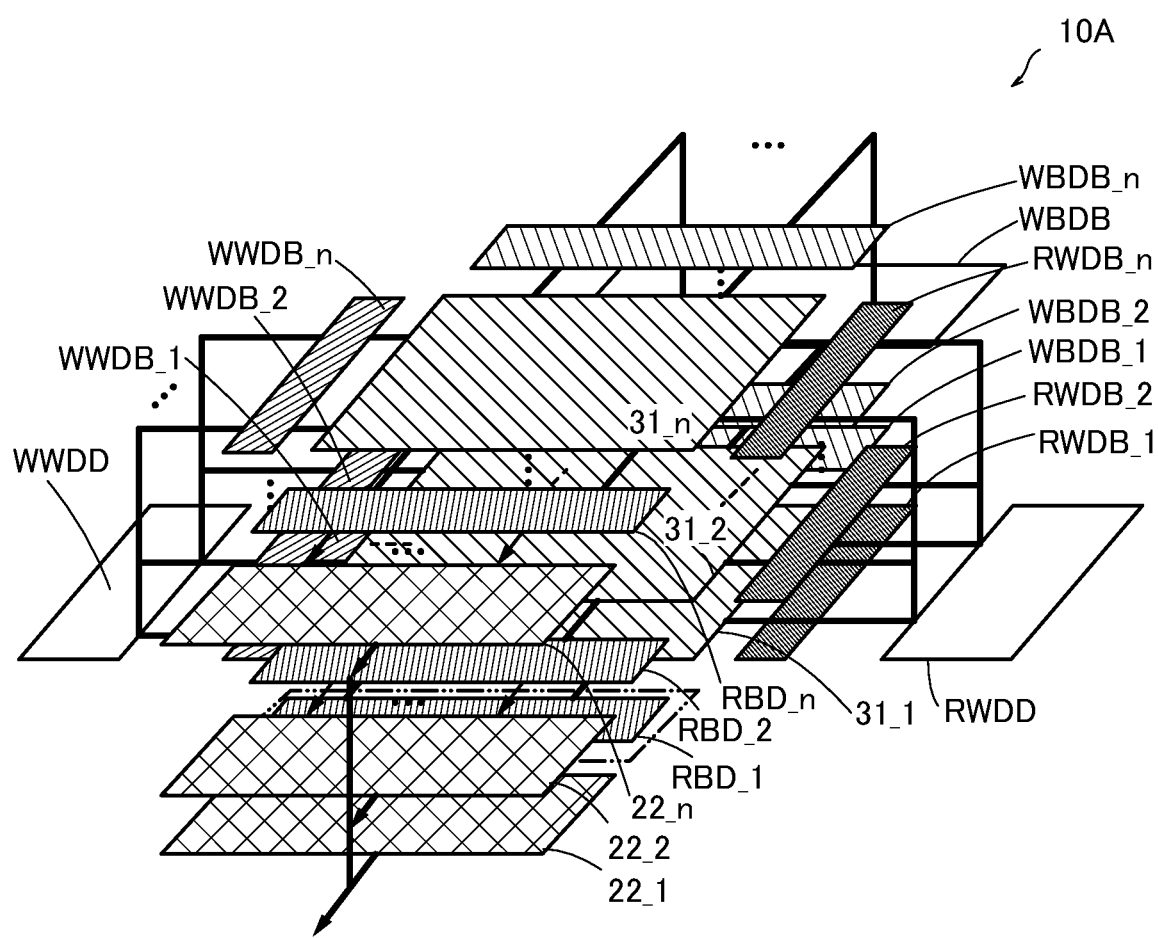
FIG. 8 illustrates the structure example of the semiconductor device.

FIG. 7 is a block diagram illustrating a semiconductor device 10A having a structure different from the structure example of the semiconductor device 10 illustrated in FIG. 2. The semiconductor device 10A illustrated in FIG. 7 is different from the semiconductor device 10 of FIG. 2 in that the same layer as the memory layer 30 included in the memory cell array 31 serves some of the functions of the driver circuit portion 21 and the arithmetic circuit portion 22. In other words, the memory layer 30 includes, in addition to the memory cell array 31, a circuit which executes some of the functions of the driver circuit portion 21. FIG. 8 is a schematic diagram illustrating the plurality of driver circuits included in the driver circuit portion 21 of the semiconductor device 10A and a placement example thereof.

In the semiconductor device 10A of FIG. 7, a driver circuit WWDD and a driver circuit WWDB are illustrated as circuits corresponding to the driver circuit WWD of FIG. 2. The driver circuit WWDD has a function of a decoder circuit which outputs a selection signal to the driver circuit WWDB. The driver circuit WWDB has a function of a buffer circuit which amplifies the selection signal and outputs the amplified signal to the wiring WWL.

Furthermore, in the semiconductor device 10A of FIG. 7, a driver circuit RWDD and a driver circuit RWDB are illustrated as circuits corresponding to the driver circuit RWD of FIG. 2. The driver circuit RWDD has a function of a decoder circuit which outputs a selection signal to the driver circuit RWDB. The driver circuit RWDB has a function of a buffer circuit which amplifies the selection signal and outputs the amplified signal to the wiring RWL.

In the semiconductor device 10A of FIG. 7, a driver circuit WBDD and a driver circuit WBDB are illustrated as circuits corresponding to the driver circuit WBD of FIG. 2. The driver circuit WBDD has a function of a decoder circuit which outputs a data signal to the driver circuit WBDB. The driver circuit WBDB has a function of a buffer circuit which amplifies the data signal and outputs the data signal to the wiring RBL.

In the semiconductor device 10A illustrated in FIG. 7, the driver circuit WWDB, the driver circuit RWDB, and the driver circuit WBDB functioning as the buffer circuits are provided in the same layer as the memory cell array 31 in the memory layer 30. In addition, in the semiconductor device 10A illustrated in FIG. 7, the driver circuit RBD and the arithmetic circuit portion 22 are provided in the same layer as the memory cell array 31 in the memory layer 30. Furthermore, in the semiconductor device 10A illustrated in FIG. 7, the driver circuit WWDD, the driver circuit RWDD, and the driver circuit WBDD are provided in the driver circuit portion 21. As illustrated in FIG. 1, the driver circuit portion 21 is provided in the driver circuit layer 20, and the memory layers 30 are stacked over the driver circuit layer 20.

The number of driver circuits WWDB, the number of driver circuits RWDB, the number of driver circuits WBDB, the number of driver circuits RBD, and the number of arithmetic circuit portions 22 are each n, which corresponds to the number of stacked memory layers 30. Specifically, as illustrated in FIG. 8, to correspond to the memory layers 30_1 to 30_n, driver circuits WWDB_1 to WWDB_n, driver circuits RWDB_1 to RWDB_n, driver circuits WBDB_1 to WBDB_n, the driver circuits RBD_1 to RBD_n, and arithmetic circuit portions 22_1 to 22n can be provided as the driver circuit WWDB, the driver circuit RWDB, the driver circuit WBDB, the driver circuit RBD, and the arithmetic circuit portion 22, respectively. Furthermore, as illustrated in FIG. 8, the driver circuit WWDD, the driver circuit RWDD, and the driver circuit WBDD are provided so as to be connected to the driver circuits WWDB_1 to WWDB_n, the driver circuits RWDB_1 to RWDB_n, and the driver circuits WBDB_1 to WBDB_n.

The driver circuit WWDB_1 is connected to the wiring WWL (not shown) functioning as a write word line connected to the memory cell 32 of the memory cell array 31 included in the memory layer 30_1. Similarly, the driver circuits WWDB_2 to WWDB_n are connected to the wirings WWL (not shown) functioning as write word lines connected to the memory cells 32 of the memory cell arrays 31 included in the memory layers 30_2 to 30_n. Similarly, the driver circuits WBDB_1 to WBDB_n, the driver circuits RWDB_1 to RWDB_n, and the driver circuits RBD_1 to RBD_n are connected to the wirings WBL, RWL, and RBL connected to the memory cells 32 of the memory cell arrays 31 included in the memory layers 30_1 to 30_n.

The driver circuits WWDB_1 to WWDB_n, the driver circuits WBDB_1 to WBDB_n, and the driver circuits RWDB_1 to RWDB_n can independently drive the memory cell array 31 in each of the memory layers 30. Therefore, while a first arithmetic operation is executed in the arithmetic circuit portions 22_1 to 22_n, second data used for a second arithmetic operation can be rewritten to memory cell arrays other than a first memory cell array where first data used for the first arithmetic operation is stored. That is, the memory cell arrays can independently perform a writing operation or a reading operation; thus, an update to second data can be performed while the first arithmetic operation is executed. Accordingly, a semiconductor device with high arithmetic efficiency can be provided.

While the first arithmetic operation is executed in the arithmetic circuit portions 22_1 to 22_n, the memory cell arrays other than the first memory cell array where the first data used for the first arithmetic operation is stored can be power gated. For example, in the case where an arithmetic operation is executed using data stored in the memory cell array 31 of the memory layer 30_1, the driver circuit WWDD, the driver circuit WBDD, and the driver circuit RWDD which drive the memory cell arrays 31 of the memory layers 30_2 to 30_n can be power gated.

Figure 9A:
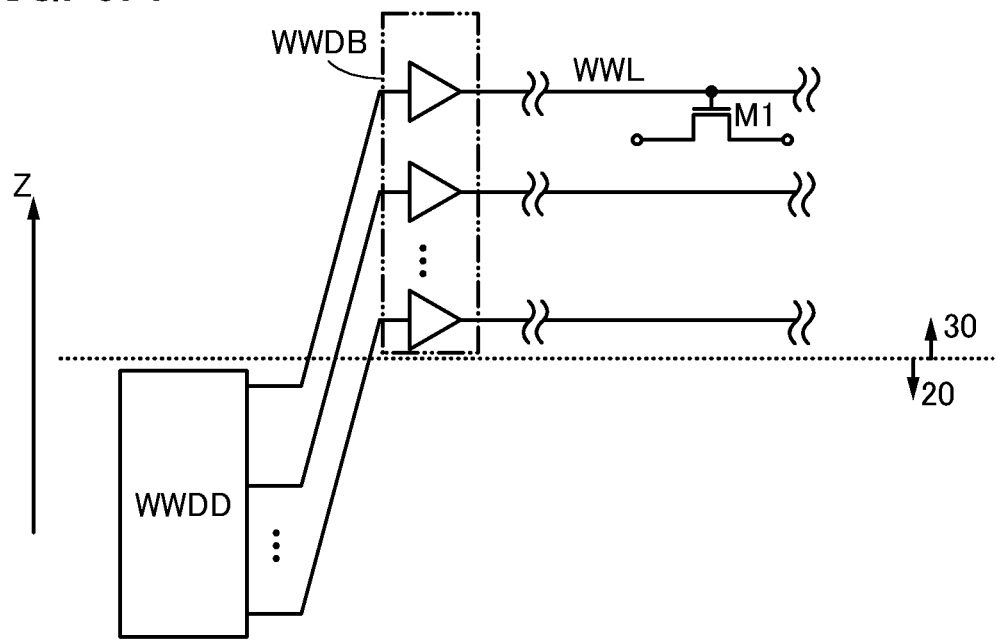
FIGS. 9A to 9C illustrate the structure example of the semiconductor device.

FIG. 9A is a schematic diagram illustrating a relationship between the driver circuit WWDD and the driver circuit WWDB which are described with reference to FIG. 7 and FIG. 8. The driver circuit WWDD functioning as a decoder circuit is provided in the driver circuit layer 20. The driver circuit WWDB functioning as a buffer circuit is provided in the memory layer 30. FIG. 9A illustrates the transistor M1 included in the memory cell 32 in the memory layer 30 and the wirings WWL each connected to the corresponding transistor M1. The driver circuit layer and the memory layer 30 are provided to be stacked in the Z direction as described with reference to FIG. 1 and the like. Thus, the circuit area of the driver circuit portion 21 where the driver circuits are provided in accordance with the number of stacked memory layers 30 can be reduced. A similar structure can be applied to not only the driver circuit WWDB but also the driver circuit WBDD and the driver circuit RWDD.

Figure 9B:
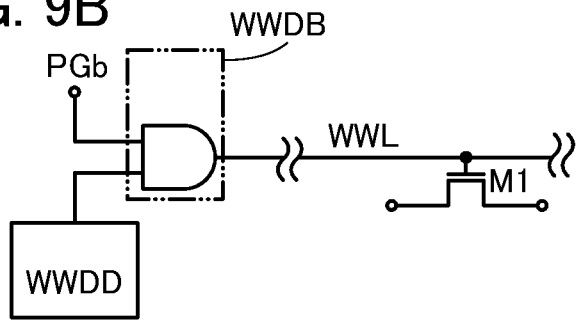

The driver circuit WWDB may have a function of a logic circuit to which a signal for power gating control is input as well as the function of a buffer circuit. In that case, as illustrated in FIG. 9B, an AND circuit to which a selection signal output by the driver circuit WWDD and a control signal PGb are input can be used as the driver circuit WWDB. The control signal PGb is an inverted signal of a control signal PG for power gating control. At the H level of the control signal PG, power gating control is performed, and at the L level of the control signal PG, a normal operation is performed. When power gating control is performed, the control signal PGb is set at the L level to fix the potential of the wiring WWL at the L level, whereby the transistor M1 can be in an off state.

Figure 9C:
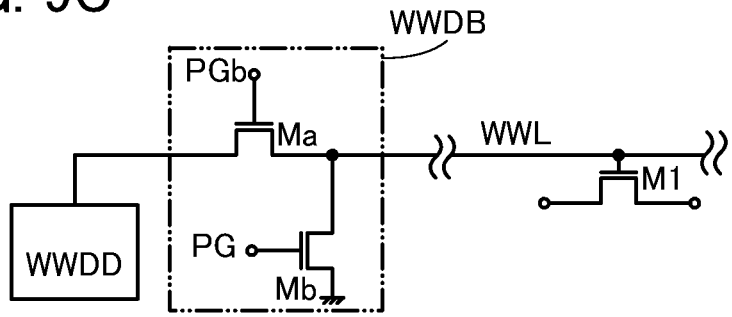

As an example of a circuit that functions as the AND circuit in the structure of FIG. 9B, a circuit structure illustrated in FIG. 9C can be used. When power gating control is performed by supplying the control signals PG and PGb to transistors Ma and Mb, the control signal PGb is set at the L level to fix the potential of the wiring WWL at the L level, whereby the transistor M1 can be in an off state.

In the case where the arithmetic circuit portion 22 is provided in the same layer as the memory layer, a structure having an arithmetic function in the memory cells 32 is preferable. An example of this structure is described with reference to FIG. 10.

Figure 10:
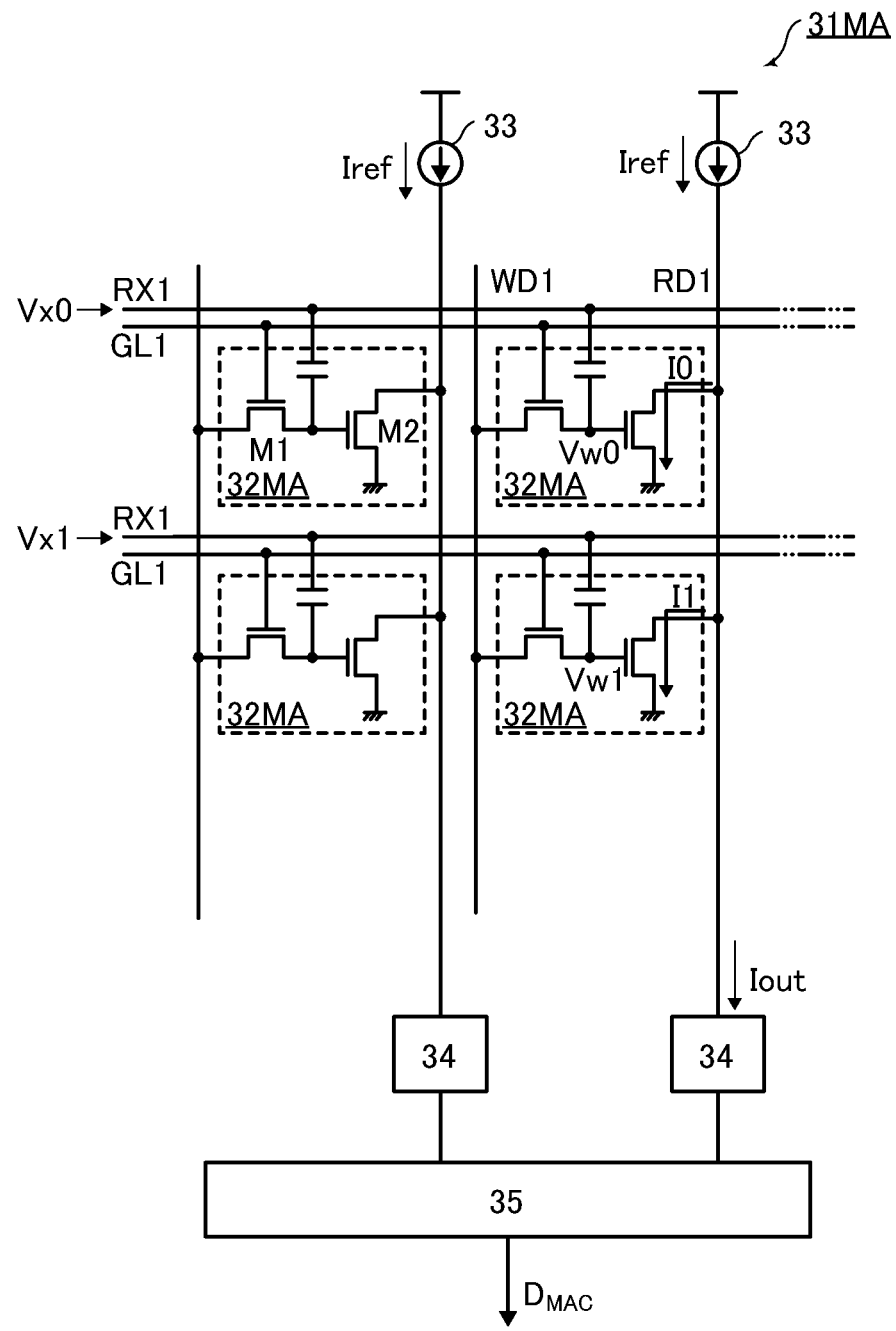
FIG. 10 illustrates the structure example of the semiconductor device.

With reference to FIG. 10, a circuit structure example of a memory cell array 31MA is described. In the memory cell array 31MA, memory cells 32MA functioning as a multiplier circuit are provided in a matrix. The memory cells 32MA has the same circuit structure as a 2 T NOSRAM. In other words, the memory cells 32MA has both functions of an arithmetic circuit and a memory circuit storing weight coefficients. The memory cell array 31MA can perform massively parallel processing with much fewer transistors than those used for a GPU. A reduction in the number of transistors results in reductions in size and power consumption of the semiconductor device.

In the memory cell array 31MA, wirings GL1, RX1, WD1, and RD1 are provided according to the arrangement of the memory cells 32MA. The wiring WD1 is a wiring for inputting weight coefficient data to the memory cells 32MA. To the wiring WD1, analog data is input. The wiring GL1 is a signal line for selecting the memory cells 32MA to which weight coefficient data is to be input.

When weight coefficient data w0 is written to the memory cell 32MA, the voltage of a retention node (the gate of the transistor M2) in the memory cell 32MA becomes a voltage Vw0 that corresponds to the weight coefficient data. Furthermore, when weight coefficient data w1 is written to the memory cell 32MA, the voltage of the retention node in the memory cell 32MA becomes a voltage Vw1 that corresponds to the weight coefficient data.

The wiring RX1 is a wiring for data input. Analog data is input to the wiring RX1. To the wiring RD1, an arithmetic result read from the memory cell 32MA is output. A current supply 33 and an offset circuit 34 are connected to the wiring RD1.

Current I0 flowing through the memory cell 32MA is proportional to the product of the voltage Vw0 of the retention node and a voltage Vx0 of the wiring RX1. That is, the current I0 represents the product of the weight coefficient and the input data. Similarly, the current I1 is proportional to the product of a voltage Vw1 and a voltage Vx1 of the retention node. That is, the memory cell 32MA can calculate the product of the weight coefficient data and input data.

The current supply 33 generates a reference current Iref. A current Tout input to the offset circuit 34 is a difference between the reference current Iref and a current Imac. The current Imac is a total amount of current flowing through the memory cells 32MA and represents a value of the sum of products of the weight coefficient and the input data. By obtaining the difference between the reference current Iref and the Imac, noise components of the current Tout can be reduced.

The offset circuit 34 converts the current Tout into a voltage Vout and obtains a difference between the reference voltage Vref and the voltage Vout. Accordingly, noise components of the voltage Vout are reduced. The offset circuit 34 amplifies a differential voltage between the Vref and the Vout and outputs the amplified voltage to an activation function circuit 35. The activation function circuit 35 outputs processed data $D_{MAC}$.

Since the input data and the output data of the memory cell array 31MA are analog, the number of wirings in the memory cell array 31MA can be significantly reduced compared with the case where input data and output data is digital. The memory cell 32MA does not read data at the time of an arithmetic operation because of having both the multiplier function and the function of retaining the weight coefficient data. That is, the memory cell 32MA substantially does not have time penalty and power penalty in data communication.

The memory cell 32MA is a 2T NOSRAM; multiplication of analog data can be performed with a small number of transistors. The memory cell 32MA may have a 3T NOSRAM circuit structure. When the product-sum operation portion is formed using many memory cells 32MA, a low-power-consumption semiconductor device capable of massively parallel processing can be provided.

This embodiment can be implemented in combination with any of the other embodiments described in this specification as appropriate.

Embodiment 3

In this embodiment, structures of transistors that can be used in the semiconductor device described in the above embodiment will be described. For example, a structure in which transistors having different electrical characteristics are stacked will be described. With such a structure, the degree of freedom in design of a semiconductor device can be increased. Stacking transistors having different electrical characteristics can increase the integration degree of the semiconductor device.

Figure 11:
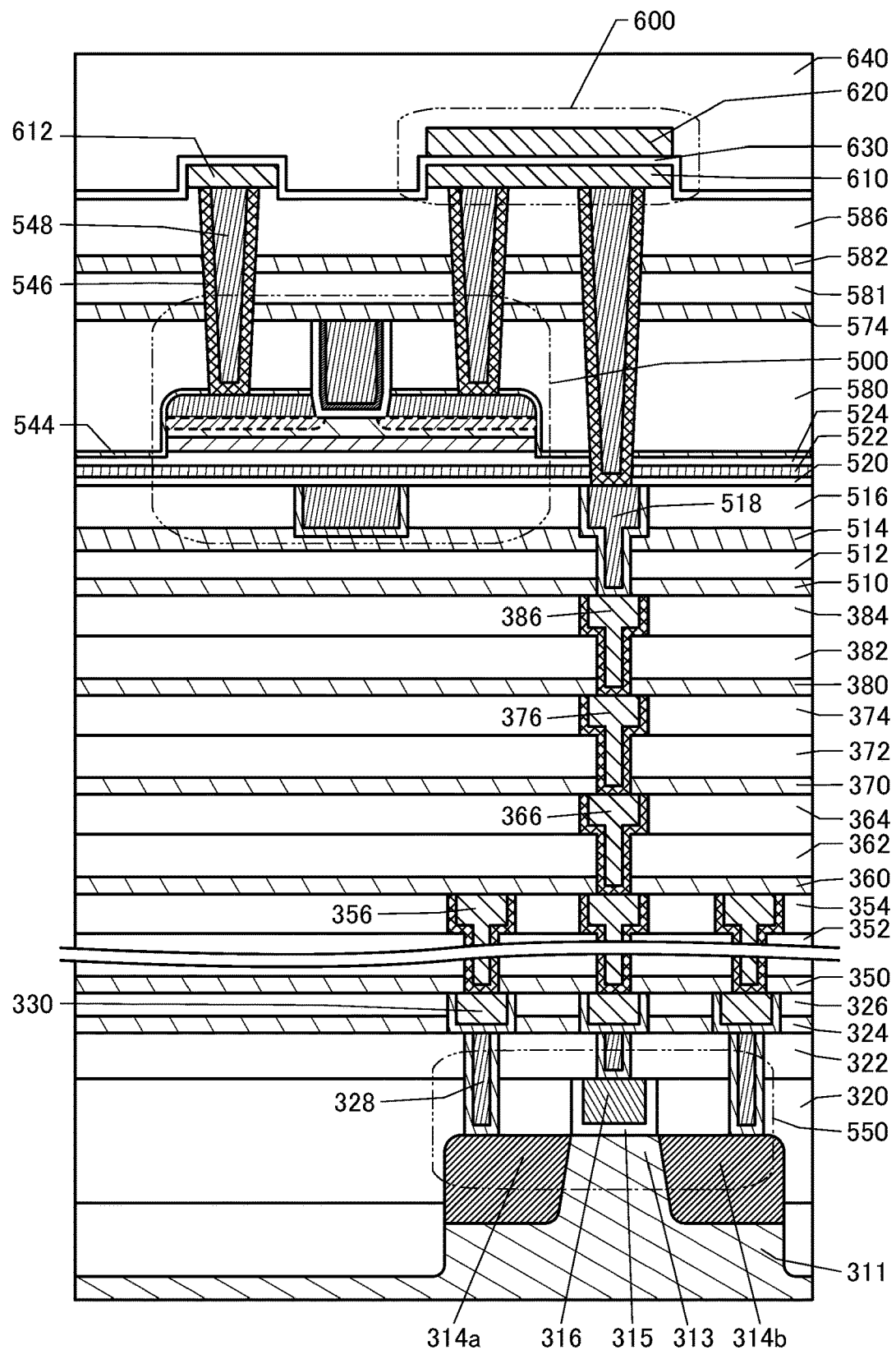
FIG. 11 illustrates the structure example of the semiconductor device.
Figure 12A:
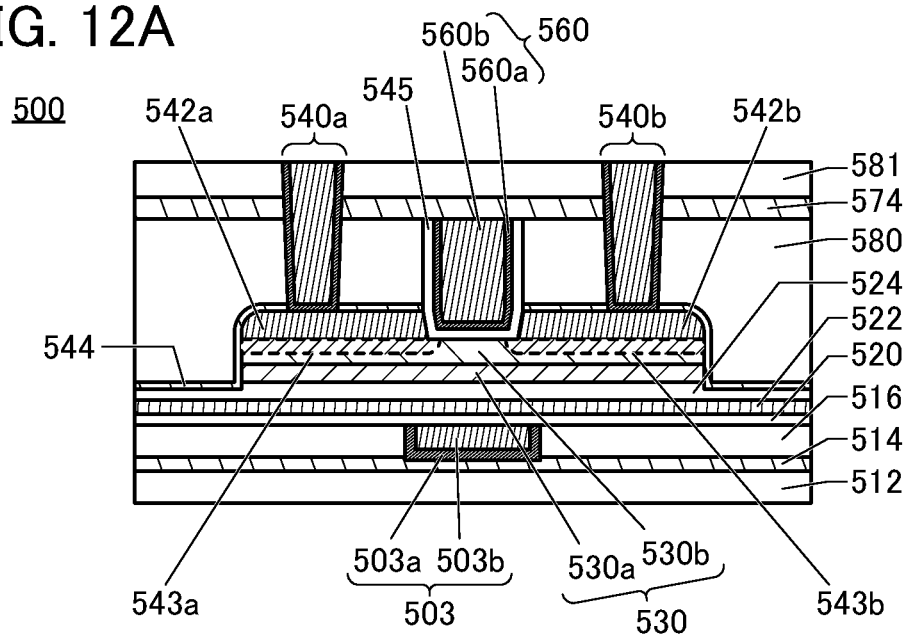
FIGS. 12A to 12C illustrate the structure example of the semiconductor device.
Figure 12B:
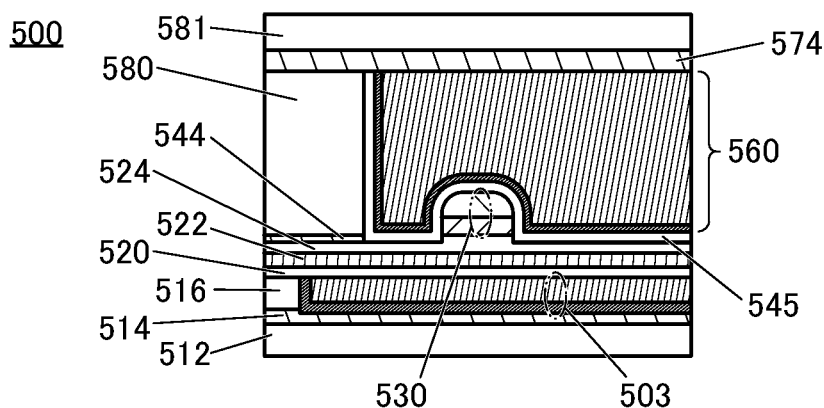
Figure 12C:
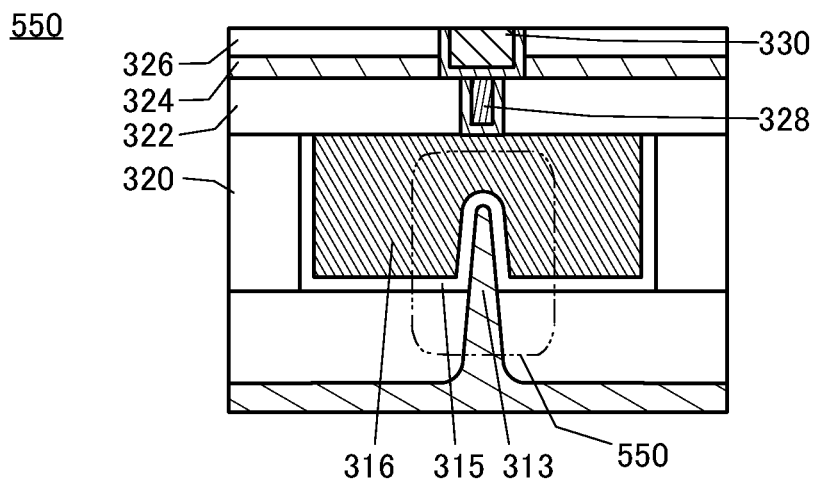

FIG. 11 illustrates part of a cross-sectional structure of a semiconductor device. The semiconductor device illustrated in FIG. 11 includes a transistor 550, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 550 in the channel width direction. For example, the transistor 500 and the transistor 550 correspond to the OS transistor and the Si transistor, respectively, described in the above embodiment.

In FIG. 11, the transistor 500 is provided above the transistor 550, and the capacitor 600 is provided above the transistor 550 and the transistor 500.

The transistor 550 is provided in and on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 12C, the top surface and the side surface in the channel width direction of the semiconductor region 313 of the transistor 550 are covered with the conductor 316 with the insulator 315 positioned therebetween. Such a Fin-type transistor 550 can have an increased effective channel width and thus have improved on-state characteristics. In addition, contribution of the electric field of the gate electrode can be increased, so that the off-state characteristics of the transistor 550 can be improved.

Note that the transistor 550 may be either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 550 may be a high electron mobility transistor (HEMT) with GaAs and GaAlAs, or the like.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material such as silicon containing the element that imparts n-type conductivity (e.g., arsenic or phosphorus) or the element that imparts p-type conductivity (e.g., boron), or a conductive material such as a metal material, an alloy material, or a metal oxide material.

Note that a material used for a conductor determines the work function; thus, selecting the material used for the conductor can adjust the threshold voltage of a transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

The transistor 550 may be formed using a silicon on insulator (SOI) substrate, for example.

As the SOI substrate, any of the following substrates may be used: a separation by implanted oxygen (SIMOX) substrate formed in such a manner that an oxygen ion is implanted into a mirror-polished wafer, and then, an oxide layer is formed at a certain depth from the surface and defects generated in a surface layer are eliminated by high-temperature annealing, and an SOI substrate formed by a Smart-Cut method in which a semiconductor substrate is cleaved by utilizing growth of a minute void, which is formed by implantation of a hydrogen ion, by heat treatment; an epitaxial layer transfer (ELTRAN: registered trademark) method; or the like. A transistor formed using a single crystal substrate contains a single crystal semiconductor in a channel formation region.

An insulator 320, an insulator 322, an insulator 324, and an insulator 326 are stacked sequentially to cover the transistor 550.

The insulator 320, the insulator 322, the insulator 324, and the insulator 326 are formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may function as a planarization film for eliminating a level difference caused by the transistor 550 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen, impurities, or the like from diffusing from the substrate 311, the transistor 550, or the like into a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $1\times10^{16}$ atoms/cm$^2$, preferably less than or equal to $5\times10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

A conductor 328, a conductor 330, and the like that are connected to the capacitor 600 or the transistor 500 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 11. Furthermore, a conductor 356 is formed in the insulator 350, the insulator 352, and the insulator 354. The conductor 356 functions as a plug or a wiring that is connected to the transistor 550. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 550 and the transistor 500 can be separated by a barrier layer, so that the hydrogen diffusion from the transistor 550 into the transistor 500 can be inhibited.

Note that as the conductor having a barrier property against hydrogen, tantalum nitride is preferably used, for example. By stacking tantalum nitride and tungsten, which has high conductivity, hydrogen diffusion from the transistor 550 can be inhibited while the conductivity of a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 11. Furthermore, a conductor 366 is formed in the insulator 360, the insulator 362, and the insulator 364. The conductor 366 functions as a plug or a wiring. Note that the conductor 366 can be formed using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 364 and the conductor 366. For example, an insulator 370, an insulator 372, and an insulator 374 are stacked sequentially in FIG. 11. Furthermore, a conductor 376 is formed in the insulator 370, the insulator 372, and the insulator 374. The conductor 376 functions as a plug or a wiring. Note that the conductor 376 can be formed using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 374 and the conductor 376. For example, an insulator 380, an insulator 382, and an insulator 384 are stacked sequentially in FIG. 11. Furthermore, a conductor 386 is formed in the insulator 380, the insulator 382, and the insulator 384. The conductor 386 functions as a plug or a wiring. Note that the conductor 386 can be formed using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. In such a structure, the transistor 550 and the transistor 500 can be separated by a barrier layer, so that the hydrogen diffusion from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or five or more.

An insulator 510, an insulator 512, an insulator 514, and an insulator 516 are stacked sequentially over the insulator 384. A material having a barrier property against oxygen, hydrogen, or the like is preferably used for any of the insulator 510, the insulator 512, the insulator 514, and the insulator 516.

For example, each of the insulator 510 and the insulator 514 is preferably formed using a film having a barrier property which prevents hydrogen, impurities, or the like from diffusing from the substrate 311, a region where the transistor 550 is provided, or the like into a region where the transistor 500 is provided. Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 functions as a plug or a wiring that is connected to the capacitor 600 or the transistor 550. The conductor 518 can be formed using a material similar to that for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 550 and the transistor 500 can be separated by a layer having a barrier property against oxygen, hydrogen, and water, so that the hydrogen diffusion from the transistor 550 into the transistor 500 can be inhibited.

The transistor 500 is provided over the insulator 516.

As illustrated in FIGS. 12A and 12B, the transistor 500 includes the conductor 503 embedded in the insulator 514 and the insulator 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b apart from each other over the oxide 530b, an insulator 580 that is over the conductor 542a and the conductor 542b and has an opening between the conductor 542a and the conductor 542b, an insulator 545 on a bottom surface and a side surface of the opening, and a conductor 560 that is over and in contact with the insulator 545.

As illustrated in FIGS. 12A and 12B, an insulator 544 is preferably provided between the insulator 580 and the oxide 530a, the oxide 530b, the conductor 542a, and the conductor 542b. In addition, as illustrated in FIGS. 12A and 12B, the conductor 560 preferably includes a conductor 560a provided over the insulator 545 and a conductor 560b embedded inside the opening and provided over the conductor 560a. Moreover, as illustrated in FIGS. 12A and 12B, an insulator 574 is preferably provided over the insulator 580, the conductor 560, and the insulator 545.

In this specification and the like, the oxide 530a and the oxide 530b may be collectively referred to as an oxide 530.

The transistor 500 has, in the region where the channel is formed and its vicinity, a structure in which the oxide 530a and the oxide 530b are stacked; however, the present invention is not limited thereto. For example, a single layer of the oxide 530b or a stacked-layer structure of three or more layers may be provided.

Although the conductor 560 has a two-layer structure in the transistor 500, the present invention is not limited thereto. For example, the conductor 560 may have a single-layer structure or a stacked-layer structure of three or more layers. The transistor 500 illustrated in FIG. 11 and FIG. 12A is just an example and is not limited to the structure illustrated therein, and an appropriate transistor can be used in accordance with a circuit structure, a driving method, or the like.

Here, the conductor 560 functions as a gate electrode of the transistor, and the conductor 542a and the conductor 542b function as a source electrode and a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential applied to the conductor 503 independently of a potential applied to the conductor 560, the threshold voltage of the transistor 500 can be controlled. In particular, when a negative potential is applied to the conductor 503, the threshold voltage of the transistor 500 can be increased to higher than 0 V, and the off-state current can be reduced.

Thus, a drain current when a potential applied to the conductor 560 is 0 V can be smaller in the case where a negative potential is applied to the conductor 503 than in the case where the negative potential is not applied to the conductor 503.

The conductor 503 is provided to overlap with the oxide 530 and the conductor 560.

Accordingly, in the case where potentials are applied to the conductor 560 and the conductor 503, an electric field generated from the conductor 560 and an electric field generated from the conductor 503 are connected, thereby covering the channel formation region in the oxide 530.

In this specification and the like, a transistor structure in which a channel formation region is electrically surrounded by the electric field of a first gate electrode is referred to as a surrounded channel (s-channel) structure. The s-channel structure disclosed in this specification and the like is different from a Fin structure or a planar structure. The s-channel structure disclosed in this specification and the like can be regarded as a kind of the Fin structure. In this specification and the like, the Fin structure refers to a structure in which at least two surfaces (specifically, two surface, three surfaces, four surfaces, or the like) of a channel are covered with a gate electrode. With the use of the Fin structure or the s-channel structure, a transistor with high resistance to a short-channel effect, i.e., a transistor in which a short-channel effect is unlikely to occur, can be obtained.

When the transistor has the above-described s-channel structure, the channel formation region can be electrically surrounded. Since the s-channel structure is a structure with the electrically surrounded channel formation region, the s-channel structure is, in a sense, equivalent to a gate all around (GAA) structure or a lateral gate all around (LGAA) structure. In the transistor having any of the s-channel structure, GAA structure, and LGAA structure, the channel formation region that is formed at the interface between the oxide 530 and the gate insulator or in the vicinity of the interface spreads throughout the entire bulk of the oxide 530. Consequently, the density of current flowing through the transistor can be improved, so that the on-state current or the field-effect mobility of the transistor can be increased.

The conductor 503 has a structure similar to that of the conductor 518; a conductor 503a is formed in contact with an inner wall of the opening in the insulator 514 and the insulator 516, and a conductor 503b is formed over the conductor 503a so as to be embedded in the opening. Although the conductor 503a and the conductor 503b are stacked in the transistor 500, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which the above oxygen is less likely to pass. Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 also functions as a wiring, the conductor 503b is preferably formed using a conductive material with high conductivity that contains tungsten, copper, or aluminum as its main component. Although the conductor 503 has a stacked layer of the conductor 503a and the conductor 503b in this embodiment, the conductor 503 may have a single-layer structure.

The insulator 520, the insulator 522, and the insulator 524 function as a second gate insulating film.

Here, an insulator containing oxygen more than that in the stoichiometric composition is preferably used as the insulator 524 in contact with the oxide 530. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies (also referred to as $V_O$) in the oxide 530 can be reduced, leading to an improvement in reliability of the transistor 500. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, $V_OH$ in the oxide 530 is preferably reduced as much as possible so that the oxide 530 becomes a highly purified intrinsic or substantially highly purified intrinsic oxide. In order to obtain such an oxide semiconductor with sufficiently reduced $V_OH$, it is important to remove impurities such as moisture and hydrogen in the oxide semiconductor (this treatment is also referred to as dehydration or dehydrogenation treatment) and supply oxygen to the oxide semiconductor to fill oxygen vacancies (this treatment is also referred to as oxygen adding treatment). When an oxide semiconductor with sufficiently reduced impurities such as $V_OH$ is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O + H$ occurs. Part of hydrogen generated at this time is bonded to oxygen to be $H_2O$, and removed from the oxide 530 or an insulator near the oxide 530 in some cases. In other cases, part of hydrogen is gettered by the conductor 542.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The microwave treatment is performed under a pressure of 133 Pa or higher, preferably 200 Pa or higher, further preferably 400 Pa or higher. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O + O \rightarrow null$. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In the case where the insulator 524 includes an excess-oxygen region, the insulator 522 preferably has a function of inhibiting diffusion of oxygen (e.g., oxygen atoms and oxygen molecules). That is, it is preferable that oxygen be less likely to pass through the insulator 522.

The insulator 522 preferably has a function of inhibiting diffusion of oxygen, impurities, or the like, in which case diffusion of oxygen contained in the oxide 530 to the insulator 520 side is prevented. In addition, the conductor 503 can be inhibited from reacting with oxygen in the insulator 524, the oxide 530, or the like.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, that is, an insulating material through which the above oxygen is less likely to pass. Aluminum oxide, hafnium oxide, an oxide containing aluminum and hafnium (hafnium aluminate), or the like is preferably used for the insulator containing an oxide of one or both of aluminum and hafnium. The insulator 522 formed of such a material functions as a layer that inhibits release of oxygen from the oxide 530 or entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIGS. 12A and 12B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is used as the oxide 530 including a channel formation region. For example, as the oxide 530, a metal oxide such as an In—M—Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an atomic layer deposition (ALD) method. Note that the metal oxide functioning as an oxide semiconductor will be described in detail in another embodiment.

The metal oxide functioning as the channel formation region in the oxide 530 has a band gap of 2 eV or more, preferably 2.5 eV or more. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a structure including oxide layers that differ in the atomic ratio of metal atoms. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a.

The energy of the conduction band minimum of the oxide 530a is preferably higher than that of the oxide 530b. In other words, the electron affinity of the oxide 530a is preferably smaller than that of the oxide 530b.

Here, the energy level of the conduction band minimum is gradually varied at a junction portion of the oxide 530a and the oxide 530b. In other words, the energy level of the conduction band minimum at a junction portion of the oxide 530a and the oxide 530b is continuously varied or continuously connected. To vary the energy level gradually, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In-Ga-Zn oxide, it is preferable to use an In—Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b have a single-layer structure in FIG. 12A, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 12A, a region 543a (a region 543b) is sometimes formed as a low-resistance region at and near the interface between the oxide 530 and the conductor 542a (the conductor 542b). In that case, the region 543a functions as one of a source region and a drain region, and the region 543b functions as the other of the source region and the drain region. A channel formation region is formed in a region between the region 543a and the region 543b.

When the conductor 542a and the conductor 542b are provided in contact with the oxide 530, the oxygen concentrations of the region 543a and the region 543b sometimes decrease. In addition, a metal compound layer that contains the metal contained in the conductor 542a and the conductor 542b and the component of the oxide 530 is sometimes formed in the region 543a and the region 543b. In such cases, the region 543a and the region 543b each have increased carrier density to be a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductor 542a and the conductor 542b are oxidation-resistant or do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530b. Moreover, the oxidation of the conductor 542 due to excess oxygen in the insulator 580 can be inhibited.

The insulator 545 functions as a first gate insulating film. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably lowered. The thickness of the insulator 545 is preferably greater than or equal to 1 nm and less than or equal to 20 nm.

Furthermore, in order that excess oxygen of the insulator 545 can be efficiently supplied to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 545 may have a stacked-layer structure like the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 12A and 12B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen in the insulator 545. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance and become a conductor. Such a conductor can be referred to as an oxide conductor (OC) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water and hydrogen in the insulator 580 is preferably lowered.

The opening of the insulator 580 is formed to overlap with a region between the conductor 542a and the conductor 542b. Thus, the conductor 560 is embedded in the opening of the insulator 580 and the region between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 545. When the insulator 574 is formed by a sputtering method, the insulator 545 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 positioned therebetween. The conductor 540a and the conductor 540b have a structure similar to that of a conductor 546 and a conductor 548 described later.

An insulator 582 is provided over the insulator 581. A material having a barrier property against oxygen, hydrogen, or the like is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. In the case where a material with a relatively low dielectric constant is used for the insulator, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 550. The conductor 546 and the conductor 548 can be formed using a material similar to that for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 positioned therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, is used.

An insulator 640 is provided over the conductor 620 and the insulator 630. The insulator 640 can be formed using a material similar to that for the insulator 320. The insulator 640 may function as a planarization film that covers a roughness thereunder.

With the use of the structure, a semiconductor device that includes a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a silicon on insulator (SOI) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. Examples of a material for a flexible substrate, an attachment film, a base film, or the like include plastic typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, an aramid resin, an epoxy resin, an inorganic vapor deposition film, and paper can be used. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption or higher integration.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. The separation layer can be used when part or the whole of a semiconductor device formed over the separation layer is separated from the substrate and transferred to another substrate. In such a case, the transistor, the resistor, the capacitor, and/or the like can be transferred to a substrate having low heat resistance, a flexible substrate, or the like. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Note that the transistor 550 illustrated in FIG. 11 is just an example and is not limited to the structure illustrated therein, and an appropriate transistor can be used in accordance with a circuit structure, a driving method, or the like. For example, when the semiconductor device is composed of only OS transistors (i.e., transistors having the same polarity, e.g., only n-channel transistors), the transistor 550 has a structure similar to that of the transistor 500.

The structures, configurations, methods, and the like described in this embodiment can be used in an appropriate combination with any of the structures, configurations, methods, and the like described in the other embodiments.

Embodiment 4

In this embodiment, cross-sectional structure examples of a memory device including OS transistors, which is a DOSRAM or a NOSRAM and described in the above embodiments, are described.

Figure 13:
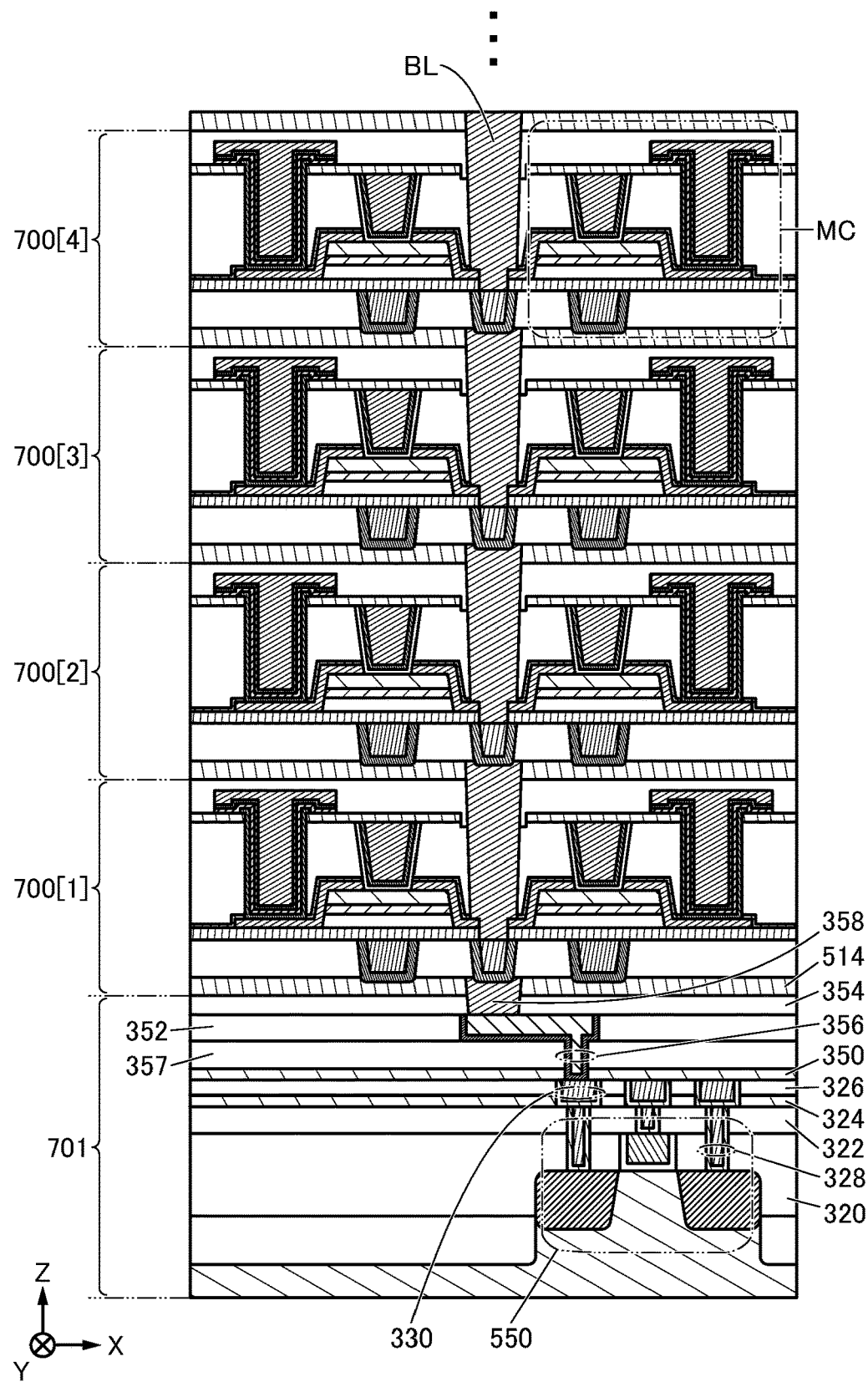
FIG. 13 illustrates a structure example of a memory portion.

FIG. 13 illustrates a cross-sectional structure example of the case of using a DOSRAM circuit structure. In the example illustrated in FIG. 13, memory layers 700[1] to 700[4] are stacked over a driver circuit layer 701.

FIG. 13 illustrates the transistor 550 included in the driver circuit layer 701 as an example. The transistor 550 described in the above embodiment can be used as the transistor 550 here.

The transistor 550 illustrated in FIG. 13 is just an example and is not limited to the structure illustrated therein, and an appropriate transistor can be used in accordance with a circuit structure or a driving method.

A wiring layer provided with an interlayer film, a wiring, a plug, and the like may be provided between the driver circuit layer 701 and the memory layers 700 or between a k-th memory layer 700 and a (k+1)-th memory layer 700. In this embodiment and the like, the k-th memory layer 700 is referred to as the memory layer 700[k], and the (k+1)-th memory layer 700 is referred to as the memory layer 700[k+1], in some cases. Here, k is an integer greater than or equal to 1 and less than or equal to N. In this embodiment and the like, the solutions of "k+α (α is an integer greater than or equal to 1)" and "k−α" are each an integer greater than or equal to 1 and less than or equal to N.

A plurality of wiring layers can be provided in accordance with the design. Furthermore, in this specification and the like, a wiring and a plug electrically connected to the wiring may be a single component. That is, part of a conductor functions as a wiring in some cases, and part of a conductor functions as a plug in other cases.

For example, the insulator 320, the insulator 322, the insulator 324, and the insulator 326 are stacked in this order over the transistor 550 as interlayer films. The conductor 328 or the like is embedded in the insulator 320 and the insulator 322. The conductor 330 or the like is embedded in the insulator 324 and the insulator 326. Note that the conductor 328 and the conductor 330 each function as a contact plug or a wiring.

The insulator functioning as an interlayer film may function as a planarization film that covers a roughness thereunder. For example, the top surface of the insulator 320 may be planarized by planarization treatment using a CMP method or the like to increase the level of planarity.

A wiring layer may be provided over the insulator 326 and the conductor 330. For example, in FIG. 13, the insulator 350, an insulator 357, the insulator 352, and the insulator 354 are stacked in this order over the insulator 326 and the conductor 330. The conductor 356 is formed in the insulator 350, the insulator 357, and the insulator 352. The conductor 356 functions as a contact plug or a wiring.

Over the insulator 354, the insulator 514 included in the memory layer 700[1] is provided. A conductor 358 is embedded in the insulator 514 and the insulator 354. The conductor 358 functions as a contact plug or a wiring. For example, a wiring BL and the transistor 550 are electrically connected to each other through the conductor 358, the conductor 356, the conductor 330, and the like.

Figure 14A:
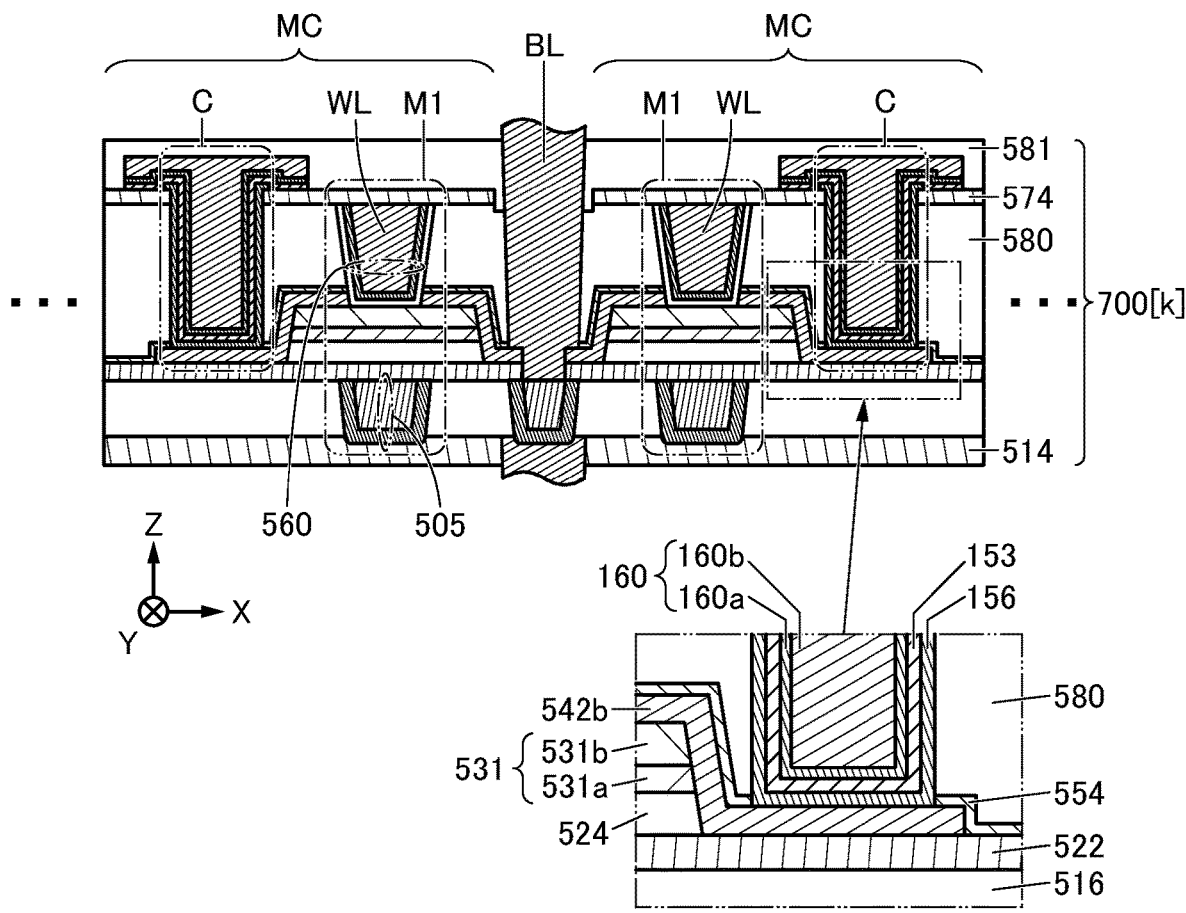
FIG. 14A illustrates a structure example of a memory layer and FIG. 14B illustrates an equivalent circuit of the memory layer.
Figure 14B:
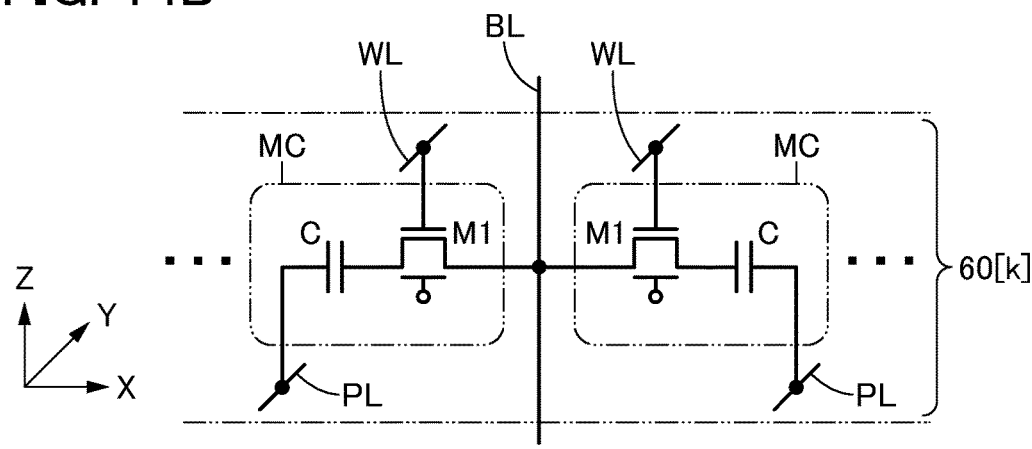

FIG. 14A illustrates a cross-sectional structure example of the memory layer 700[k]. FIG. 14B is an equivalent circuit diagram of FIG. 14A. FIG. 14A illustrates an example where two memory cells MC are electrically connected to one wiring BL.

The memory cell MC illustrated in FIG. 13 and FIG. 14A includes the transistor M1 and the capacitor C. As the transistor M1, the transistor 500 described in the above embodiment can be used.

In this embodiment, a variation of the transistor 500 is illustrated as the transistor M1. Specifically, the transistor M1 is different from the transistor 500 in that the conductor 542a and the conductor 542b extend beyond an edge of a metal oxide 531.

The memory cell MC illustrated in FIG. 13 and FIG. 14A includes a conductor 156 functioning as one terminal of the capacitor C, an insulator 153 functioning as a dielectric, and a conductor 160 (a conductor 160a and a conductor 160b) functioning as the other terminal of the capacitor C. The conductor 156 is electrically connected to part of the conductor 542b. The conductor 160 is electrically connected to the wiring PL (not shown in FIG. 14A).

The capacitor C is formed in an opening portion that is provided by removal of part of the insulator 574, part of the insulator 580, and part of an insulator 554. Since the conductor 156, the insulator 153, and the conductor 160a are formed along a side surface of the opening portion, the conductor 156, the insulator 153, and the conductor 160a are preferably formed by an ALD method, a CVD method, or the like.

The conductor 156 and the conductor 160 may be formed using a conductor that can be used for the conductor 503 or the conductor 560. For example, the conductor 156 may be formed using titanium nitride by an ALD method. The conductor 160a may be formed using titanium nitride by an ALD method, and the conductor 160b may be formed using tungsten by a CVD method. Note that in the case where the adhesion of tungsten to the insulator 153 is sufficiently high, a single-layer film of tungsten formed by a CVD method may be used as the conductor 160.

For the insulator 153, an insulator of a high dielectric constant (high-k) material (material with a high relative permittivity) is preferably used. As the insulator of high dielectric constant material, an oxide, an oxynitride, a nitride oxide, or a nitride containing one or more kinds of metal element selected from aluminum, hafnium, zirconium, gallium, and the like can be used, for example. The above-described oxide, oxynitride, nitride oxide, and nitride may contain silicon. Insulating layers each formed of any of the above-described materials can be stacked to be used as the insulator 153.

As the insulator of high dielectric constant material, aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, an oxynitride containing hafnium and zirconium, or the like can be used, for example. Using such a high dielectric constant material allows the insulator 153 to be thick enough to inhibit a leakage current and a sufficiently high capacitance of the capacitor C to be ensured.

It is preferable to use stacked insulating layers each formed of any of the above-described materials. A stacked structure using a high dielectric constant material and a material having higher dielectric strength than the high dielectric constant material is preferably used. For example, as the insulator 153, an insulating film in which zirconium oxide, aluminum oxide, and zirconium oxide are stacked in this order can be used. An insulating film in which zirconium oxide, aluminum oxide, zirconium oxide, and aluminum oxide are stacked in this order can be used, for example. An insulating film in which hafnium zirconium oxide, aluminum oxide, hafnium zirconium oxide, and aluminum oxide are stacked in this order can be used, for example. The stacking of such an insulator having relatively high dielectric strength, such as aluminum oxide, can increase the dielectric strength and inhibit electrostatic breakdown of the capacitor C.

Figure 15:
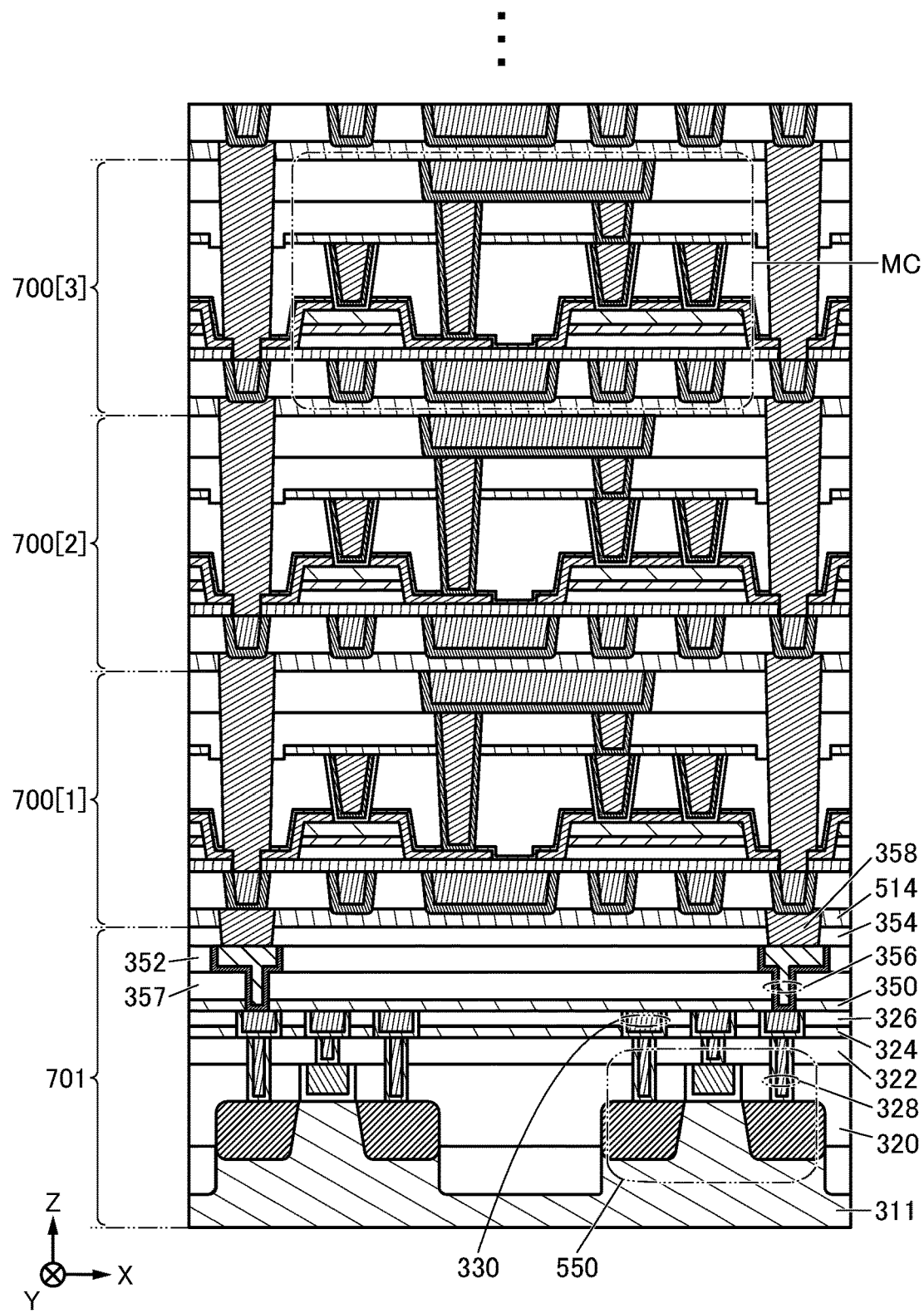
FIG. 15 illustrates a structure example of a memory portion.
Figure 16A:
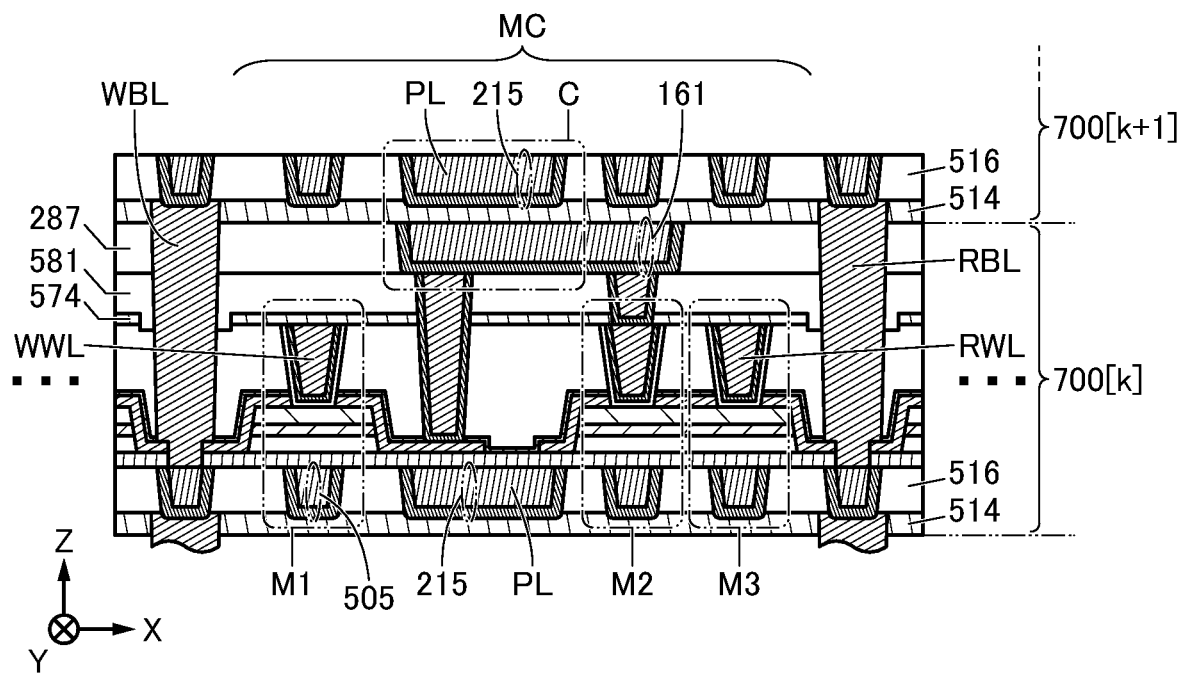
FIG. 16A illustrates a structure example of a memory layer and FIG. 16B illustrates an equivalent circuit of the memory layer.
Figure 16B:
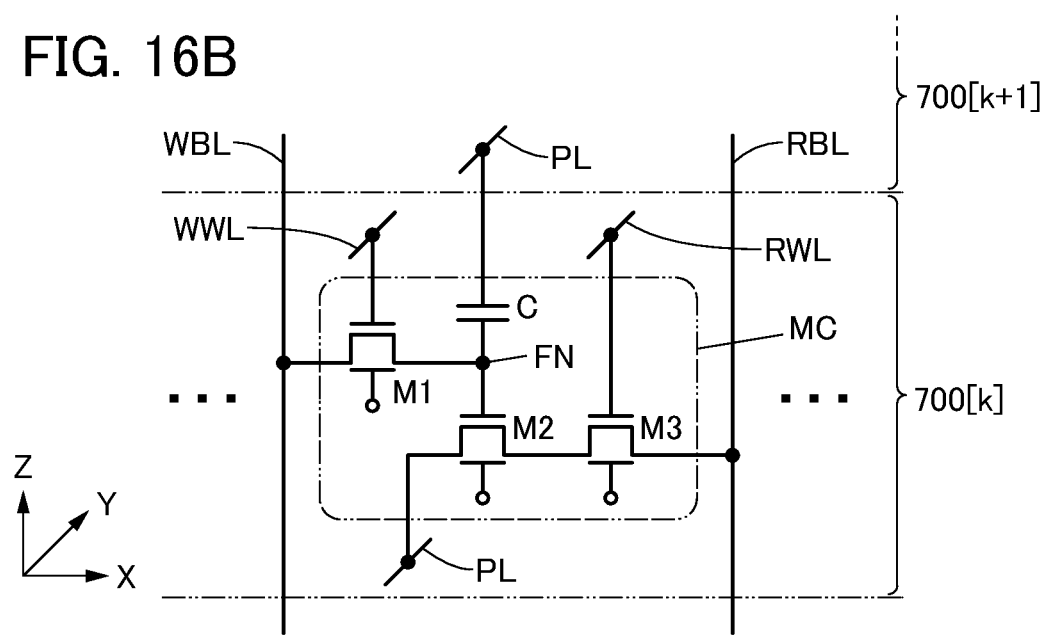

FIG. 15 illustrates a cross-sectional structure example of the case of using a NOSRAM memory cell circuit structure. FIG. 15 is also a variation of FIG. 13. FIG. 16A illustrates a cross-sectional structure example of the memory layer 700[k]. FIG. 16B is an equivalent circuit diagram of FIG. 16A.

The memory cell MC illustrated in FIG. 15 and FIG. 16A includes the transistor M1, the transistor M2, and the transistor M3 over the insulator 514. A conductor 215 is provided over the insulator 514. The conductor 215 can be formed using the same material in the same process as those of the conductor 503 at the same time.

The transistor M2 and the transistor M3 illustrated in FIG. 15 and FIG. 16A share one island-shaped metal oxide 531. In other words, a part of the one island-shaped metal oxide 531 functions as a channel formation region of the transistor M2, and another part thereof functions as a channel formation region of the transistor M3. Furthermore, the source of the transistor M2 and a drain of the transistor M3 are shared, or the drain of the transistor M2 and a source of the transistor M3 are shared. Thus, the area occupied by the transistors M2 and M3 is smaller than that of the case where the transistors M2 and M3 are independently provided.

In the memory cell MC illustrated in FIG. 15 and FIG. 16A, an insulator 287 is provided over the insulator 581, and a conductor 161 is embedded in the insulator 287. The insulator 514 of the memory layer 700[k+1] is provided over the insulator 287 and the conductor 161.

In FIG. 15 and FIG. 16A, the conductor 215 of the memory layer 700[k+1] functions as one terminal of the capacitor C, the insulator 514 of the memory layer 700[k+1] functions as a dielectric of the capacitor C, and the conductor 161 functions as the other terminal of the capacitor C. The other of the source and the drain of the transistor M1 is electrically connected to the conductor 161 through a contact plug, and the gate of the transistor M2 is electrically connected to the conductor 161 through another contact plug.

This embodiment can be implemented in combination with any of the other embodiments described in this specification as appropriate.

Embodiment 5

In this embodiment, an example of a chip including the semiconductor device of one embodiment of the present invention and an example of a module of an electronic device will be described.

Figure 17A:
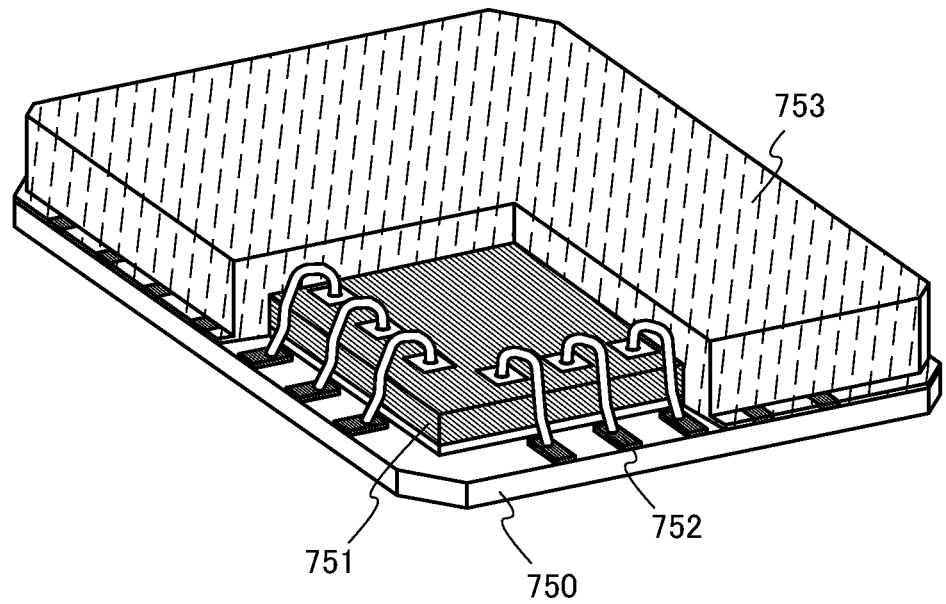
FIGS. 17A and 17B each illustrate a structure example of a semiconductor device.

FIG. 17A is a perspective view illustrating a cross-sectional structure of a package using a lead frame interposer.

In the package illustrated in FIG. 17A, a chip 751 corresponding to the semiconductor device of one embodiment of the present invention is connected to a terminal 752 over an interposer 750 by a wire bonding method. The terminal 752 is placed on a surface of the interposer 750 on which the chip 751 is mounted. The chip 751 can be sealed by a mold resin 753, in which case the chip 751 is sealed so that part of each of the terminals 752 is exposed.

Figure 17B:
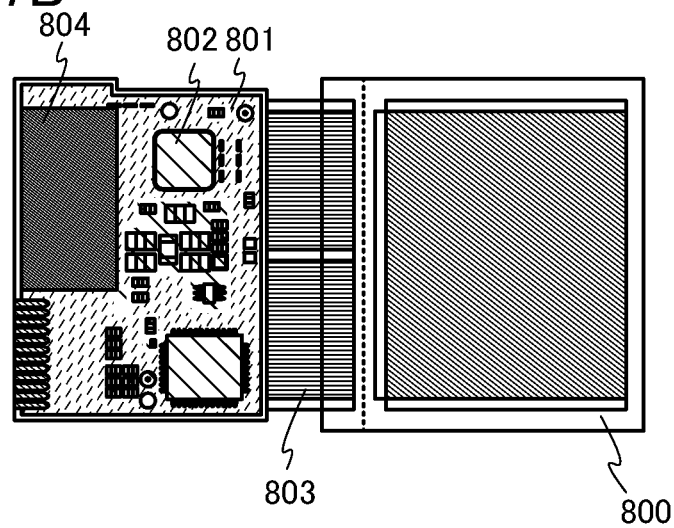

FIG. 17B illustrates the structure of a module of an electronic device in which the package is mounted on a circuit board.

In the module of a mobile phone illustrated in FIG. 17B, a package 802 and a battery 804 are mounted on a printed wiring board 801. In addition, the printed wiring board 801 is mounted on a panel 800 including a display element by an FPC 803.

The structure described above in this embodiment can be combined as appropriate with any of the structures described in the other embodiments.

Embodiment 6

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can include the semiconductor device of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio units and digital audio players), copiers, facsimiles, printers, multifunction printers, automated teller machines (ATM), and vending machines. FIGS. 18A to 18F illustrate specific examples of these electronic devices.

Figure 18A:
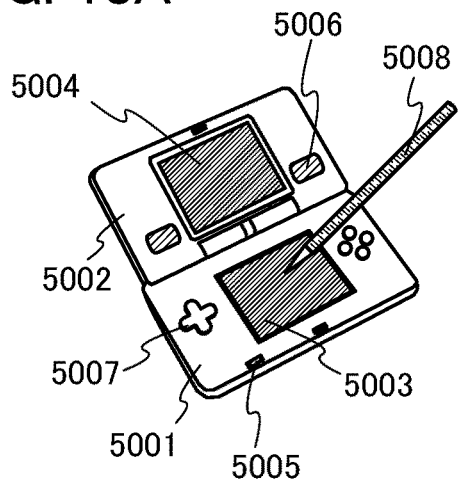
FIGS. 18A to 18F illustrate structure examples of electronic devices.

FIG. 18A illustrates a portable game console, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in the portable game console. Although the portable game console illustrated in FIG. 18A includes the two display portions 5003 and 5004, the number of display portions included in the portable game console is not limited to two.

Figure 18B:
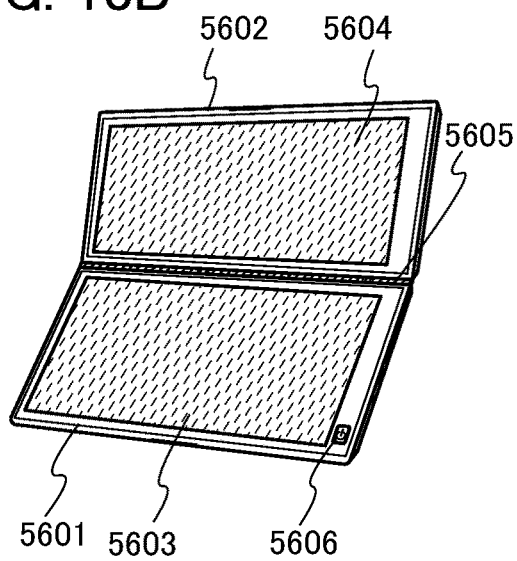

FIG. 18B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. The semiconductor device of one embodiment of the present invention can be used for a variety of integrated circuits included in the portable information terminal. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 18C:
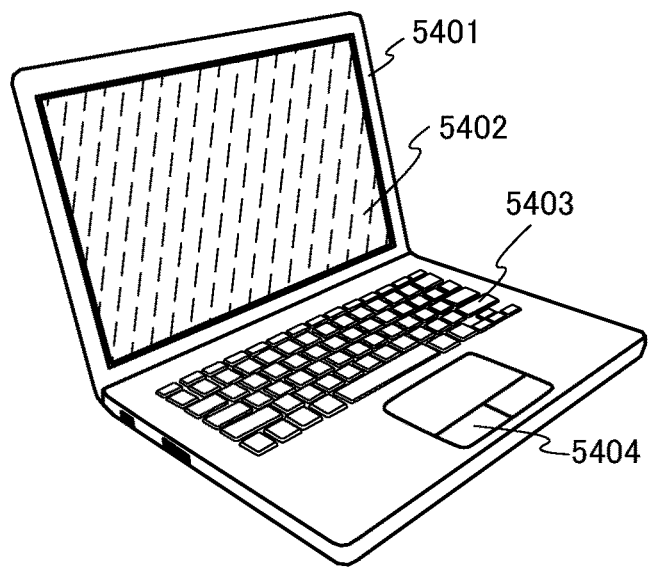

FIG. 18C illustrates a notebook type personal computer including a housing 5401, a display portion 5402, a keyboard 5403, a pointing device 5404, and the like. The semiconductor device of one embodiment of the present invention can be used for a variety of integrated circuits included in the notebook personal computer.

Figure 18D:
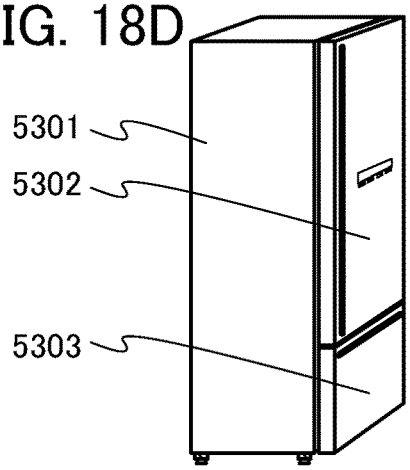

FIG. 18D illustrates an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 18E:
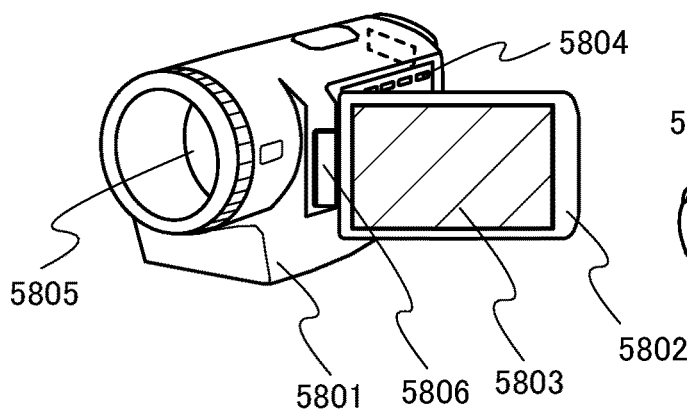

FIG. 18E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The semiconductor device of one embodiment of the present invention can be used for a variety of integrated circuits included in the video camera. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 18F:
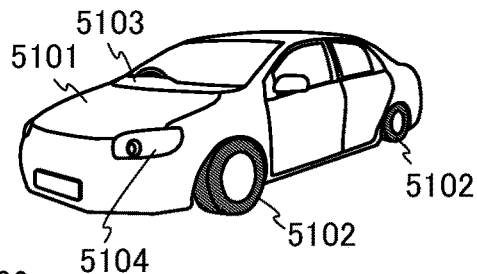

FIG. 18F illustrates a motor vehicle including a car body 5101, wheels 5102, a dashboard 5103, lights 5104, and the like. The semiconductor device of one embodiment of the present invention can be used for a variety of integrated circuits included in the motor vehicle.

The structures, configurations, methods, and the like described in this embodiment can be used in an appropriate combination with any of the structures, configurations, methods, and the like described in the other embodiments.

<Notes on Description of this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part thereof) in an embodiment can be applied to, combined with, or replaced with another content (or part thereof) in the same embodiment and/or a content (or part thereof) in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be created.

In this specification and the like, components are classified on the basis of the functions and shown as blocks independent of each other in block diagrams. However, in an actual circuit and the like, such components are sometimes hard to classify functionally, and there is a case where one circuit is associated with a plurality of functions or a case where a plurality of circuits are associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and an embodiment of the present invention is not limited to shapes or values shown in the drawings. For example, the following can be included: a variation in a signal, a voltage, or a current due to noise or difference in timing.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a wiring in some cases, and vice versa. Moreover, the term "electrode" or "wiring" also includes the case where a plurality of "electrodes" or "wirings" are formed in an integrated manner, for example.

In this specification and the like, voltage and potential can be interchanged with each other as appropriate. The term "voltage" refers to a potential difference from a reference potential. When the reference potential is a ground voltage, for example, "voltage" can be replaced with "potential". The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed to the term "conductive film" in some cases. As another example, the term "insulating film" can be changed into the term "insulating layer" in some cases.

In this specification and the like, a switch is in a conduction state (on state) or in a non-conduction state (off state) to determine whether a current flows therethrough or not. Alternatively, a switch has a function of selecting and changing a current path.

In this specification and the like, the channel length refers to, for example, the distance between a source and a drain in a region where a semiconductor (or a portion where a current flows in a semiconductor when a transistor is on) and a gate overlap each other, or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap each other, or a region where a channel is formed.

In this specification and the like, a node can be referred to as a terminal, a wiring, an electrode, a conductive layer, a conductor, an impurity region, and the like depending on the circuit structure, the device structure, and the like. Furthermore, a terminal, a wiring, and the like can be referred to as a node.

Note that the phrase "A and B are connected" in this specification and the like also means electrical connection between A and B. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when represented by an equivalent circuit.

This application is based on Japanese Patent Application Serial No. 2022-058307 filed with Japan Patent Office on Mar. 31, 2022, the entire contents of which are hereby incorporated by reference.

What is claimed is:

1. A semiconductor device comprising:
    a driver circuit layer comprising a driver circuit portion and an arithmetic circuit portion;
    a first memory layer stacked over the driver circuit layer, the first memory layer comprising a first memory cell array; and
    a second memory layer stacked over the first memory layer, the second memory layer comprising a second memory cell array,
    wherein each of the first memory cell array and the second memory cell array is electrically connected to a write word line, a read word line, a write bit line, and a read bit line,
    wherein the driver circuit portion is configured to drive the write word line, the read word line, the write bit line, and the read bit line,
    wherein the driver circuit portion comprises a first driver circuit configured to drive the first memory cell array and a second driver circuit configured to drive the second memory cell array, and
    wherein the arithmetic circuit portion is configured to perform arithmetic processing using data retained in the first memory cell array and the second memory cell array and read by the first driver circuit and the second driver circuit.

2. The semiconductor device according to claim 1, wherein the driver circuit layer comprises a transistor comprising silicon in a channel formation region.

3. The semiconductor device according to claim 1, wherein each of the first memory layer and the second memory layer comprises a transistor comprising an oxide semiconductor in a channel formation region.

4. The semiconductor device according to claim 1, wherein the arithmetic processing is product-sum operation processing.

5. The semiconductor device according to claim 1, further comprising:
    a third memory layer stacked over the second memory layer,
    wherein the third memory layer comprises a third memory cell array, and
    wherein the driver circuit portion further comprises a third driver circuit configured to drive the third memory cell array.

6. A semiconductor device comprising:
    a driver circuit layer comprising a driver circuit portion and an arithmetic circuit portion;
    a first memory layer stacked over the driver circuit layer, the first memory layer comprising a first memory cell array; and
    a second memory layer stacked over the first memory layer, the second memory layer comprising a second memory cell array,
    wherein each of the first memory cell array and the second memory cell array is electrically connected to a write word line, a read word line, a write bit line, and a read bit line,
    wherein the driver circuit portion is configured to drive the write word line, the read word line, the write bit line, and the read bit line,
    wherein the driver circuit portion comprises a first driver circuit configured to drive the first memory cell array and a second driver circuit configured to drive the second memory cell array,
    wherein the first driver circuit is configured to read first data retained in the first memory cell array and output the first data to the arithmetic circuit portion,
    wherein the second driver circuit is configured to write second data to the second memory cell array,
    wherein reading by the first driver circuit and writing by the second driver circuit are performed at the same time, and
    wherein the arithmetic circuit portion is configured to perform arithmetic processing using the first data.

7. The semiconductor device according to claim 6, wherein the driver circuit layer comprises a transistor comprising silicon in a channel formation region.

8. The semiconductor device according to claim 6, wherein each of the first memory layer and the second memory layer comprises a transistor comprising an oxide semiconductor in a channel formation region.

9. The semiconductor device according to claim 6, wherein the arithmetic processing is product-sum operation processing.

10. The semiconductor device according to claim 6, further comprising:
    a third memory layer stacked over the second memory layer,
    wherein the third memory layer comprises a third memory cell array, and
    wherein the driver circuit portion further comprises a third driver circuit configured to drive the third memory cell array.

11. A semiconductor device comprising:
    a driver circuit layer comprising a driver circuit portion and an arithmetic circuit portion;
    a first memory layer stacked over the driver circuit layer, the first memory layer comprising a first memory cell array; and
    a second memory layer stacked over the first memory layer, the second memory layer comprising a second memory cell array,
    wherein each of the first memory cell array and the second memory cell array is electrically connected to a write word line, a read word line, a write bit line, and a read bit line,
    wherein the driver circuit portion is configured to drive the write word line, the read word line, the write bit line, and the read bit line,
    wherein the driver circuit portion comprises a first driver circuit configured to drive the first memory cell array and a second driver circuit configured to drive the second memory cell array, wherein the first driver circuit is configured to read first data retained in the first memory cell array and output the first data to the arithmetic circuit portion, wherein the second driver circuit is configured to stop outputting a control signal to the second memory cell array, wherein reading by the first driver circuit and stopping by the second driver circuit are performed at the same time, and wherein the arithmetic circuit portion is configured to perform arithmetic processing using the first data.

12. The semiconductor device according to claim 11, wherein the driver circuit layer comprises a transistor comprising silicon in a channel formation region.

13. The semiconductor device according to claim 11, wherein each of the first memory layer and the second memory layer comprises a transistor comprising an oxide semiconductor in a channel formation region.

14. The semiconductor device according to claim 11, wherein the arithmetic processing is product-sum operation processing.

15. The semiconductor device according to claim 11, further comprising:
   a third memory layer stacked over the second memory layer,
   wherein the third memory layer comprises a third memory cell array, and
   wherein the driver circuit portion further comprises a third driver circuit configured to drive the third memory cell array.

* * * * *